(12) United States Patent
Hatwar

(10) Patent No.: US 7,037,601 B2
(45) Date of Patent: *May 2, 2006

(54) WHITE LIGHT-EMITTING DEVICE STRUCTURES

(75) Inventor: Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 47 days.

This patent is subject to a terminal disclaimer.

(21) Appl. No.: 10/657,626

(22) Filed: Sep. 8, 2003

(65) Prior Publication Data

US 2004/0241491 A1 Dec. 2, 2004

Related U.S. Application Data

(63) Continuation-in-part of application No. 10/446,436, filed on May 28, 2003, now abandoned.

(51) Int. Cl.
*H05B 33/14* (2006.01)

(52) U.S. Cl. ............... 428/690; 428/917; 313/504; 313/506

(58) Field of Classification Search ......... 428/690, 428/917; 313/506, 504
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,121,029 A | 6/1992 | Hosokawa et al. | |
| 5,405,709 A | 4/1995 | Littman et al. | |
| 5,683,823 A | 11/1997 | Shi et al. | |
| 6,614,176 B1 * | 9/2003 | Kim et al. | 313/506 |
| 6,720,092 B1 * | 4/2004 | Hatwar | 428/690 |
| 2002/0113241 A1 * | 8/2002 | Kubota et al. | 257/79 |
| 2002/0113546 A1 * | 8/2002 | Seo et al. | 313/504 |
| 2003/0038287 A1 | 2/2003 | Suzuki et al. | |

FOREIGN PATENT DOCUMENTS

| | | |
|---|---|---|
| EP | 1187235 | 3/2002 |
| EP | 1286569 | 2/2003 |
| EP | 1340798 | 9/2003 |
| JP | 07-142169 | 6/1995 |
| WO | 02/100977 | 12/2002 |

OTHER PUBLICATIONS

Kido et al., in Science, vol. 267, p. 1332-1334, (1995).
Applied Physics Letters vol. 64, p. 815-817, (1994).
Deshpande et al., in Applied Physics Letters, vol. 75, p. 888-890, (1999).

* cited by examiner

*Primary Examiner*—Dawn Garrett
(74) *Attorney, Agent, or Firm*—Raymond L. Owens

(57) ABSTRACT

A white light-emitting OLED device including a spaced anode and cathode, a hole-transporting layer disposed over the anode, and a first light-emitting layer disposed on the hole-transporting layer including an electron-transporting material host and a yellow dopant for producing yellow light. The device also includes a second light-emitting layer disposed on the first light-emitting layer and including a blue host and a blue dopant for producing blue light, and an electron-transporting layer disposed between the cathode and the second light-emitting layer.

44 Claims, 9 Drawing Sheets

WHITE LIGHT-EMITTING DEVICE STRUCTURES

CROSS REFERENCE TO RELATED APPLICATIONS

This is a continuation-in-part of application Ser. No. 10/446,436, filed May 28, 2003 entitled "White Light-Emitting Device Structures" by Tukaram K. Hatwar, now abandoned.

Reference is made to commonly assigned U.S. patent application Ser. No. 09/651,624 filed Aug. 30, 2000 by Tukaram K. Hatwar, entitled "White Organic Electroluminescent Devices with Improved Stability and Efficiency", now U.S. Pat. No. 6,696,177 issued Feb. 24, 2004; Ser. No. 10/191,251 filed Jul. 8, 2002 by Tukaram K. Hatwar, entitled "White Organic Light-Emitting Devices Using Rubrene Layer", now U.S. Pat. No. 6,720,092 issued Apr. 13, 2004; Ser. No. 10/183,242 filed Jun. 27, 2002 by Benjamin P. Hoag et al., entitled "Organic Element for Electroluminescent Devices", now U.S. Pat. No. 6,661,023 issued Dec. 9, 2003; and Ser. No. 10/086,067 filed Feb. 28, 2002 by Benjamin P. Hoag et al., entitled "Organic Element for Electroluminescent Devices" now U.S. Pat. No. 6.824.893 issued Nov. 30, 2004, the disclosures of which are herein incorporated by reference.

FIELD OF THE INVENTION

The present invention relates to organic light-emitting diode devices that produce white light.

BACKGROUND OF THE INVENTION

Organic light-emitting diode (OLED) devices are attractive because of their low driving voltage, high luminance, wide-angle viewing, and capability for full-color flat emission displays. Tang et al. described a multilayer OLED device in their U.S. Pat. Nos. 4,769,292 and 4,885,211. Efficient white light producing OLED devices (white OLEDs) are considered a low cost alternative for several applications such as paper-thin light sources, backlights in LCD displays, automotive dome lights, and office lighting. As with any light-emitting device, white OLEDs should be bright and efficient in terms of power consumption, The preferred spectrum and color of a white OLED will depend on the application for which it is intended. For example, if a particular application requires light that is to be perceived as white without subsequent processing that alters the color perceived by a viewer, it is desirable that the light emitted by the white OLED have Commission International d'Eclairage (CIE) chromaticity coordinates of about (0.33, 0.33). For other applications, particularly applications in which the light emitted by the OLED is subjected to further processing light that alters its perceived color, it may be satisfactory or even desirable for the light that is emitted by the OLED to be off-white, for example bluish white, greenish white, yellowish white, or reddish white. Herein the term "white" or "substantially white" will be used broadly to mean light that is perceived as white or off-white. A white OLED will mean an OLED whose emission is white in this broad sense. In any event, in accordance with this disclosure, white light is that light which is perceived by a user as having a white color.

The following patents and publications disclose the preparation of organic OLED devices capable of emitting white light, comprising a hole-transporting layer and an organic luminescent layer, and interposed between a pair of electrodes. White OLEDs have been reported before by J. Shi (U.S. Pat. No. 5,683,823) wherein the luminescent layer includes red and blue light-emitting materials uniformly dispersed in a host emitting material. This device has good electroluminescent characteristics, but the concentrations of the red and blue dopants are very small, such as 0.12% and 0.25% of the host material. These concentrations are difficult to control during large-scale manufacturing. Sato et al. in JP 7-142169 disclose an OLED device, capable of emitting white light, made by forming a blue light-emitting layer adjacent to the hole-transporting layer and followed by a green light-emitting layer having a region containing a red fluorescent material. Kido et al., in Science, Vol. 267, P 1332 (1995) and in Applied Physics Letters Vol. 64, p. 815 (1994), report a white light producing OLED device. In this device three emitter layers with different carrier transport properties, individually emitting blue, green, or red light, are used to generate white light. Littman et al. in U.S. Pat. No. 5,405,709 disclose another white emitting device, which is capable of emitting white light in response to hole-electron recombination, and comprises a fluorescent in a visible light range from bluish green to red. Recently, Deshpande et al., in Applied Physics Letters, Vol. 75, p. 888 (1999), described a white OLED using red, blue, and green luminescent layers separated by a hole blocking layer due to specific energy relationship between the emission layer (EML) and electron-transporting layer (ETL). These device structures contain multiple layers and are difficult to manufacture.

White OLEDs can be used with color filters in full-color display devices. They can also be used with color filters in other multicolor, or functional-color display devices. White light producing OLED displays are easy to manufacture, and they produce reliable white light in each pixel of the displays. However, the color filters each transmit only about 30% of the original white light. Therefore, high luminance efficiency is required for the white OLEDs. Although the OLEDs are referred to as white and may appear white or off-white, for this application, the CIE coordinates of the light emitted by the OLED are less important than the requirement that the spectral components passed by each of the color filters be present with sufficient intensity in that light. It is also important that the color, after passage through a color filter, be appropriate for the intended application. For use in a full-color display, typical desired colors after passage through a red, green, or blue filter are, respectively, red with CIE coordinates of about (0.64, 0.36), green with CIE coordinates of about (0.29, 0.67), and blue with CIE coordinates of about (0.15, 0.19). The devices must also have good stability in long-term operation. Because the devices must be run at high luminance, this is a demanding requirement.

A problem in this application of white OLEDs is that the intensity of the white emission spectrum is frequently lower than desired. Also the stability of these devices can be lower.

SUMMARY OF THE INVENTION

It is an object of the present invention to produce white OLEDs with simple device structures and an improved efficiency and the stability.

This object is achieved by a white light-emitting OLED device, comprising:

a) a spaced anode and cathode;

b) a hole-transporting layer disposed over the anode;

c) a first light-emitting layer disposed on the hole-transporting layer including an electron-transporting material host and a yellow light-emitting dopant for producing yellow light;

d) a second light-emitting layer disposed on the first light-emitting layer and including a blue host and a blue dopant for producing blue light; and e) an electron-transporting layer disposed between the cathode and the second light-emitting layer.

Moreover, the OLED display includes a color filter array disposed in the display and including red, green, and blue filters, each one of which corresponds to a different device, so that each individual device can have current driven through it to produce white light, which is filtered by its corresponding filter.

ADVANTAGES

The following are features and advantages of the present invention.

The OLEDs of this invention have high operational stability.

Full-color or multicolor display devices made in accordance with the present invention eliminate the need for an array or plurality of OLEDs with differing emission colors, and they eliminate the need for shadow masks in the construction of such an array or plurality.

OLED devices made in accordance with the present invention can be produced consistently and with high reproducibility to provide high efficiency, low drive voltage, and good stability.

DETAILED DESCRIPTION OF THE INVENTION

Figure 1:
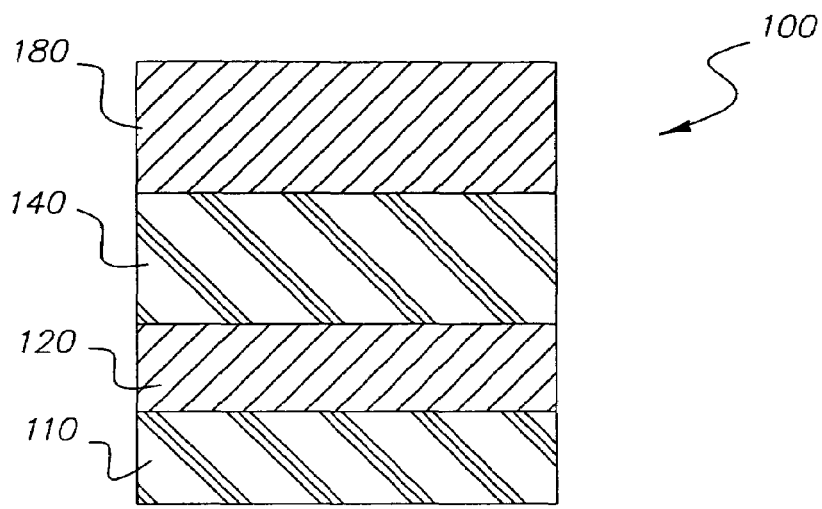
FIG. 1 depicts a prior art OLED.

A conventional OLED comprises an organic light-emitting layer together with electrical contacts that are capable of injecting electrons and holes into that layer. The organic light-emitting layer includes a material that is luminescent (that is, fluorescent or phosphorescent) and capable of transporting both electrons and holes. Light emission, known as electroluminescence (EL), is produced as a result of electron-hole pair recombination in this layer. In the simplest construction, the device 100 as shown in FIG. 1 has a substrate 110 and an organic light-emitting layer 140 sandwiched between anode 120 and cathode 180.The light-emitting layer 140 can be a single pure organic or organometallic material with a high luminescent efficiency. A well known material, suitable for this application, is tris(8-quinolinolato)aluminum(III) (Alq), which produces excellent green electroluminescence. Alternatively, the light-emitting layer 140 can comprise a host material that is capable of transporting both electrons and holes, doped with one or more luminescent dyes. Energy liberated by the recombination of electrons and holes is converted by to visible radiation by the dyes.

An OLED can be viewed as a diode, which is forward biased when the anode is at a higher potential than the cathode. Generally, an OLED is capable of transporting a large current density, equal to or exceeding 20 mA/cm$^2$, when forward biased, but transports only a very small current density, much less than 1 μA/cm$^2$, when reverse biased.

Figure 2:
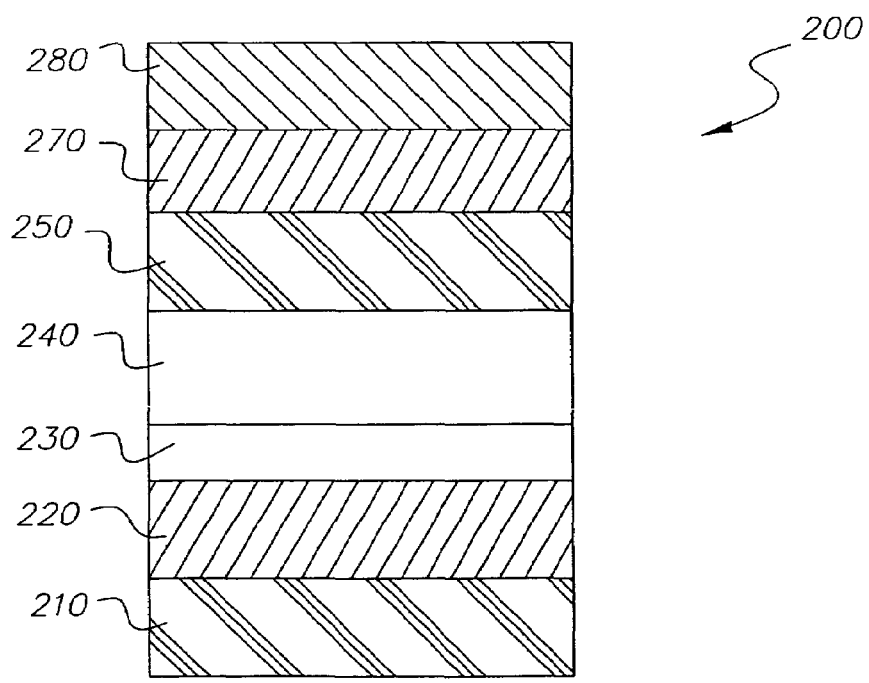
FIG. 2 depicts another prior art OLED.

The simple structure can be modified to a three-layer structure (device 200) as shown in FIG. 2, in which the light-emitting layer is situated between hole- and electron-transporting layers. The light-emitting layer functions primarily as the site for hole-electron recombination and thus electroluminescence. The additional layers serve to transport holes and electrons from the anode and the cathode, respectively, to the light-emitting layer. In this structure, the functions of the individual organic layers are distinct and can therefore be optimized independently. Thus, the light-emitting layer can be chosen to have a desirable OLED color as well as high luminance efficiency. Likewise, the electron- and hole-transporting layers can be optimized primarily for their carrier transport properties.

In FIG. 2, the organic light-emitting device 200 has a light-transmissive substrate 210 on which is disposed a light-transmissive anode 220. An organic light-emitting structure is formed between the anode 220 and a cathode 280. The organic light-emitting structure is comprised of, in sequence, a transparent organic hole-transporting layer 240, an organic light-emitting layer 250, and an organic electron-transporting layer 270. Layer 230 is an optional hole-injecting layer. When an electrical potential difference (not shown) is applied between the anode 220 and the cathode 280, the cathode will inject electrons into the electron-transporting layer 270, and the electrons will migrate across layer 260 to the light-emitting layer 250. At the same time, holes will be injected from the anode 220 into the hole-transporting layer 240 or the optional hole-injecting layer 230. The holes will migrate across layer 230, if it is present, and across layer 240 and recombine with electrons at or near a junction formed between the hole-transporting layer 240 and the light-emitting layer 250. When a migrating electron drops from its conduction energy level to a valence energy level in filling a hole, energy is released as light, which is emitted through the light-transmissive anode 220 and substrate 210. Alternatively, the electron-transporting layer and the cathode can be chosen to be transparent, thus facilitating emission of light through the cathode rather than through the substrate.

A preferred embodiment of the organic light-emitting layer includes host material doped with one or more luminescent dyes. Using such doped luminescent layers, highly efficient EL devices can be constructed. Simultaneously, the color of emitted light can be tuned by using luminescent dyes of different emission wavelengths in a common host material or in different host materials. Tang et al. in commonly assigned U.S. Pat. No. 4,769,292 have described this dopant scheme in considerable detail for EL devices using Alq as the host material. Shi et al. in commonly assigned U.S. Pat. No. 5,935,721 have described this dopant scheme in considerable detail for the blue-emitting OLED devices using 9,10-di-(2-naphthyl)anthracene (ADN) derivatives as the host material.

A full-color or multicolor display device can be constructed with an array or a plurality of OLEDs with different emission colors, typically red, green, and blue. This construction requires the fabrication of OLEDs of differing composition in the differently colored pixels.

An alternative full-color or multicolor display device can be constructed from white emitting OLEDs of a single composition, combined with red, green, and blue (RGB) color filters, that is, filters that transmit red, green, or blue light. The RGB filters may be deposited on the substrate (when light transmission is through the substrate), incorporated into the substrate, or deposited over the top electrode (when light transmission is through the top electrode). When depositing a RGB filter array over the top electrode, a buffer layer may be used to protect the top electrode. The buffer layer may comprise inorganic materials, for example, silicon oxides and nitrides, or organic materials, for example, polymers, or multiple layers of inorganic and organic materials. Methods for providing RGB filter arrays are well known in the art. Lithographic means, inkjet printing, and laser thermal transfer are just a few of the methods by which RGB filters may be provided.

This technique of producing a full-color display using white light plus RGB filters has several advantages over the precision shadow masking technology used for producing full-color displays. This technique does not require precision alignment, is low cost, and is relatively easy to manufacture. The substrate itself typically also contains thin film transistors to address the individual pixels. U.S. Pat. Nos. 5,550,066 and 5,684,365 to Tang et al. describe the addressing methods of the TFT substrates.

The OLEDs of the present invention are illustrated in FIGS. 3–14.

Figure 3:
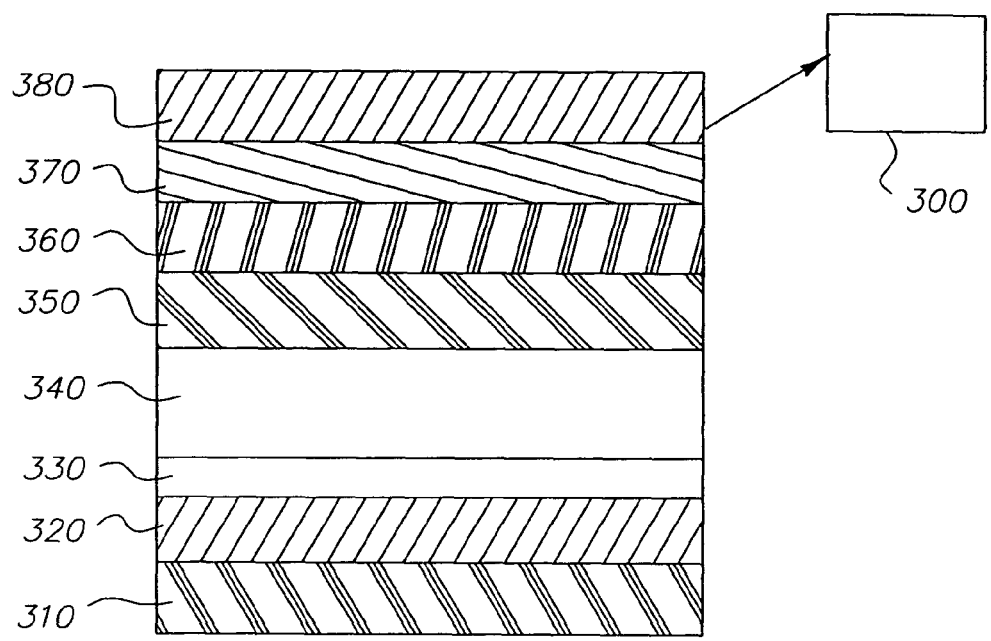
FIG. 3 depicts a first embodiment of a white light producing OLED device of this invention.

One white OLED of the present invention is illustrated in FIG. 3. The white OLED 300 has a light-transmissive substrate 310 on which is disposed a light-transmissive anode 320. An organic white light-emitting structure is formed between the anode 320 and the cathode 380. That structure includes, in sequence, an optional hole-injecting layer 330, a hole-transporting layer 340, a first light-emitting layer 350 for producing yellow light, a second light emitting layer 360 for producing blue light, and an organic electron-transporting layer 370. The second light-emitting layer 360 is constructed to emit blue light and can include a blue host, a blue light-emitting dopant, and optionally one or more additional dopants. The first light-emitting layer 350 includes an electron-transporting material host, e.g., Alq, and a yellow light-emitting dopant. The hole-transporting layer 340 is undoped.

Figure 4:
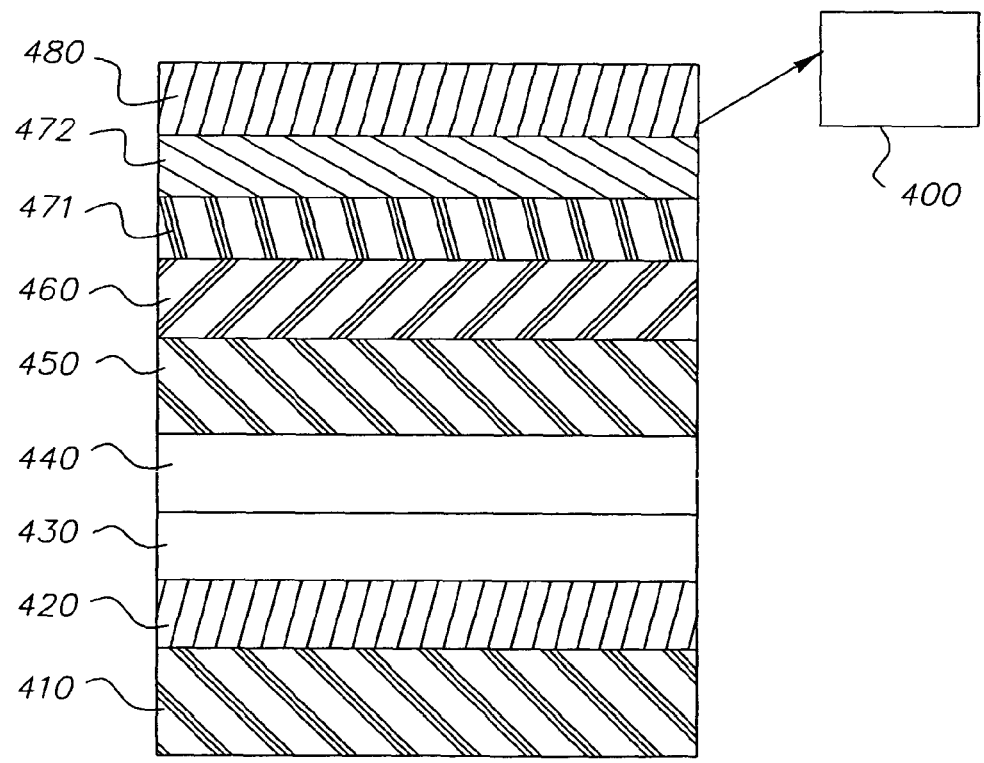
FIG. 4 depicts a second embodiment of a white light producing OLED, device of this invention.

FIG. 4 depicts a white OLED 400, which is similar to that shown in FIG. 3, except that the organic electron-transporting layer comprises two electron-transporting sublayers, 471 and 472. Sublayer 471, which is adjacent to the second light-emitting layer 460 for producing blue light, comprises a second electron-transporting material host and a second yellow light-emitting dopant, e.g., DBzR. The first light-emitting layer 450 adjacent to the hole-transporting layer 440 includes a first electron-transporting material host, e.g., Alq, and a first yellow dopant. The electron-transporting sublayer 472 contains no light-emitting dopant. The first light-emitting layer 450 and the electron-transporting sublayer 471 may have the same or different electron-transporting material host and can have the same or different yellow light-emitting dopants. Other layers of the structure 400 are substrate 410, anode 420, optional hole-injecting layer 430, hole-transporting layer 440, and cathode 480. The second light emitting layer 460 can comprise a blue host and a blue light-emitting dopant, and optionally, one or mor additional dopants.

Figure 5:
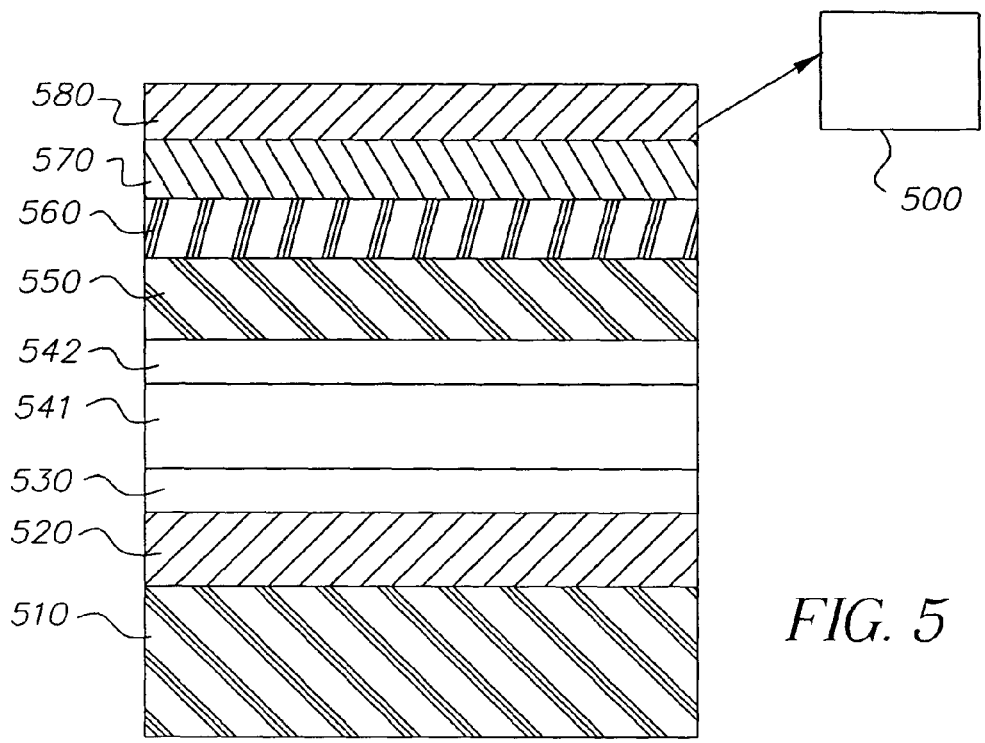
FIG. 5 depicts a third embodiment of a white light producing OLED device of this invention.

FIG. 5 depicts a white OLED 500. The hole-transporting layer comprises two hole-transporting sublayers, 541 and 542. Sublayer 542, which is adjacent to the first light-emitting layer 550, comprises a hole-transporting material host and a third yellow light-emitting dopant. The first light-emitting layer 550 comprises a first electron-transporting material host and a yellow light-emitting dopant. Sublayer 541 contains no light-emitting dopant. In this structure the hole-transporting sublayer 542 and the first light-emitting layer 550 are doped with the same or different yellow light-emitting dopants. The host for the yellow light-emitting hole-transporting sublayer 542 includes any hole-transporting material, e.g., NPB, and the host for the first light-emitting layer comprises an electron-transporting material, e.g., Alq. The second light emitting layer, 560 can comprise a blue host, a blue light-emitting dopant, and optionally, one or more additional dopants. Other layers of the structure 500 are substrate 510, anode 520, optional hole-injecting layer 530, electron-transporting layer 570 and cathode 580. The hole-transporting materials in sublayers 541 and 542 can be the same or different.

Figure 6:
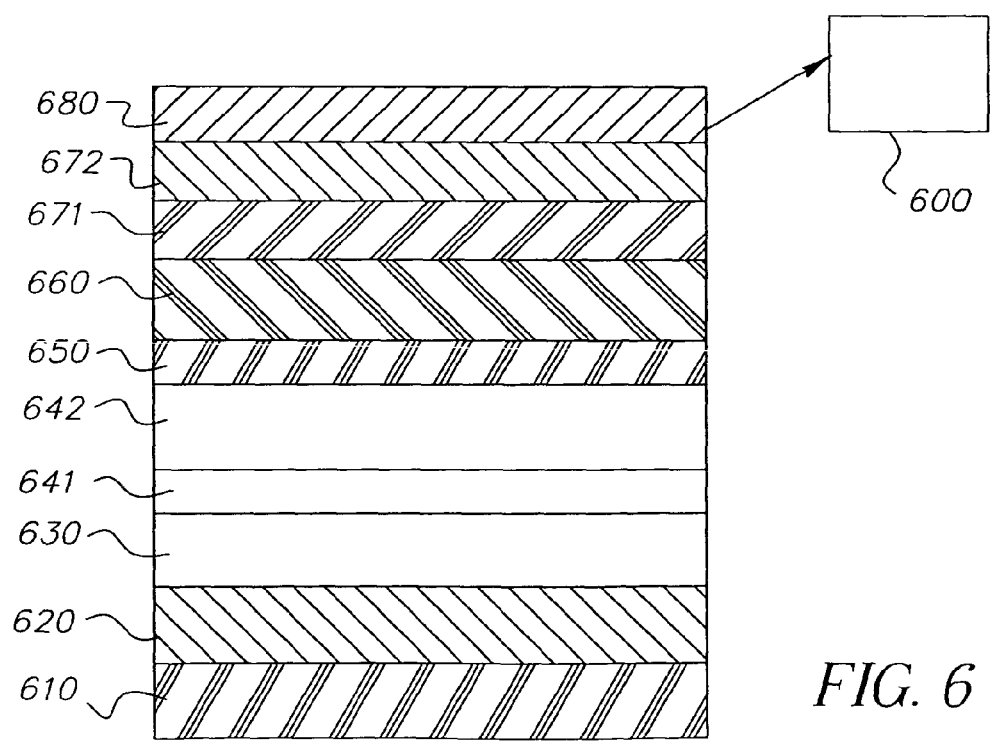
FIG. 6 depicts a fourth embodiment of a white light producing OLED device of this invention.

FIG. 6 depicts a white OLED 600. The hole-transporting layer includes of two hole-transporting sub-layers, 641 and 642. Sublayer 642 comprises a hole-transporting material host and a third yellow light-emitting dopant. The first light-emitting layer 640 contains an electron-transporting material host, e.g., Alq, and a first yellow light-emitting dopant. The second light-emitting layer 660 for emitting blue light includes a blue host, a blue light-emitting dopant, and optionally, one or more additional dopants. The electron-transporting layer comprises two electron-transporting sublayers, 671 and 672. Sublayer 671 is nearest to the second light-emitting layer and comprises a second electron-transporting material host and a second yellow-emitting dopant. The electron-transporting sublayer 672 does not contain yellow dopant. The first and second electron-transporting material hosts can be the same, e.g., Alq, or they can be different. The first, second, and third yellow light-emitting dopants can be the same or different. Other layers of structure 600 are substrate 610, anode 620, optional hole-injecting layer 630, and cathode 680.

The electron-transporting layer 370 of the white OLED structure 300 may include more than one sublayers. The sublayer nearest to the blue light-emitting layer 360 can include a green light-emitting dopant.

The electron-transporting layer 471 of the white OLED structure 400 may include one or more dopants, such as the yellow light-emitting dopant or/and a green emitting dopant.

The electron-transporting layer 570 of the white OLED structure 500 may include more than one sublayer. The sublayer nearest to the blue light-emitting layer 560 may include a green emitting dopant.

The electron-transporting layer 672 of the white OLED structure 600 may include one or more dopants, such as the yellow light-emitting dopant and/or a green emitting dopant.

An OLED of this invention is typically provided over a supporting substrate, such as substrate 310 in FIG. 3. One electrode, either the anode or the cathode can be in contact with the substrate. Alternatively, an additional layer, such as a color filter layer, can be interposed between the substrate and the nearer electrode. The electrode that is nearer to the substrate is conveniently referred to as the bottom electrode, and the other electrode as the top electrode. Conventionally, the bottom electrode is the anode, as shown for example in FIG. 3, but this invention is not limited to that configuration. If the bottom electrode is the cathode, the sequence of organic layers is reversed from that described above, and the anode is deposited over the hole-transporting layer.

The substrate can either be light-transmissive or opaque, depending on the intended direction of light emission. The light-transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore the support can be light-transmissive, light absorbing or light reflective. Substrates for use in this case include, but are not limited to, glass, plastic, semiconductor materials including silicon, ceramics, circuit board materials, and polished metal surfaces. Of course, it is necessary to provide in these device configurations a light transparent top electrode.

Although this invention has been described in terms of the specific structures shown in FIGS. 3–6, similar structures are within the scope of the invention. In particular, further subdivisions of the layers, additional dopants used for various purposes, and additional layers may be used within the spirit of the present invention. For example, very thin additional layers, doped or undoped, may be inserted between the light-emitting layer and the hole-transporting layer or the electron-transporting layer in order to modify the nature of the contact between them. The thickness of such layers would typically be 5 nm or less. For another example, the hole-transporting layer or electron-transporting layer may contain an additional dopant in order to improve the operational stability of the device. For yet another example, an additional layer may be inserted between the electron-transporting layer and the cathode in order to facilitate the injection or transport of electrons.

The anode and cathode of the OLED can each take any convenient conventional form, such as any of the various forms disclosed by Tang et al. in U.S. Pat. No. 4,885,211. Operating voltage, also known as drive voltage, can be substantially reduced when using a low-work function cathode and a high-work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitutes one preferred cathode construction. The Al:Mg cathodes of Van Slyke et al. U.S. Pat. No. 5,059,062 are another preferred cathode construction. Hung et al. in U.S. Pat. No. 5,776,622 have disclosed the use of a LiF/Al bilayer to enhanced electron injection in organic OLED devices. Cathodes made of either Mg:Ag, Al:Mg or LiF/Al are usually opaque, and displays cannot be viewed through the cathode. A series of publications by Gu et al. in Applied Physics Letters, Vol. 68, p. 2606 (1996); Burrows et al. , Journal of Applied Physics, Vol. 87, p. 3080 (2000); Parthasarathy et al. , Applied Physics Letters, Vol. 72, p. 2138 (1998); Parthasarathy et al. , Applied Physics Letters, Vol. 76, p. 2128 (2000); and Hung et al. , Applied Physics Letters, Vol. 74, p. 3209 (1999) have disclosed transparent cathodes. These transparent cathodes are based on the combination of a thin semitransparent metal (~10 nm) and indium-tin-oxide (ITO) on top of the metal.

Conventionally, the anode is formed of a conductive and transparent metal oxide. Indium tin oxide has been widely used as the anode contact because of its transparency, good conductivity, and high-work function.

In a preferred embodiment, the anode, such as anode 320 in FIG. 3, can be modified with a hole-injecting layer such as anode 320 in FIG. 3. The hole-injecting layer can serve to improve the film formation property of subsequent organic layers and to facilitate injection of holes into the hole-transporting layer. Suitable materials for use in the hole-injecting layer include, but are not limited to, porphyrinic compounds such as copper phthalocyanine (CuPc) as described in U.S. Pat. No. 4,720,432; plasma-deposited fluorocarbon polymers as described in U.S. Pat. No. 6,208,075; and certain aromatic amines such as m-MTDATA, alias 4,4',4"-tris[(3-methylphenyl)phenylamino]triphenylamine. Alternative materials for use in hole-injecting layers in OLEDs are disclosed in EP 0 891 121 A1 and EP 1 029 909 A1.

An undoped hole-transporting layer, an undoped sublayer of the hole-transporting layer, or the host material of a doped sublayer of the hole-transporting layer of this invention comprises at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single aromatic tertiary amine or a mixture of aromatic tertiary amines. Illustrative of useful aromatic tertiary amines is the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)phenylmethaneTri (p-tolyl)amine
4-(di-p-tolylamino)-4'-[4-(di-p-tolylamino)-styryl]stilbene
N,N,N',N'-Tetra-p-tolyl-4,4'-diaminobiphenyl
N,N,N',N'-Tetraphenyl-4,4'-diaminobiphenyl
N,N,N', N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene 2,6-Bis[di-(1-naphthyl)amino]naphthalene
2,6-Bis[N-(1-naphthyl)-N-(2-naphthyl)amino]naphthalene
N,N,N', N'-Tetra(2-naphthyl)-4,4"-diamino-p-terphenyl
4,4'-Bis{N-phenyl-N-[4-(1-naphthyl)-phenyl]
  amino}biphenyl
4,4'-Bis[N-phenyl-N-(2-pyrenyl)amino]biphenyl
2,6-Bis[N,N-di(2-naphthyl)amino]fluorene
1,5-Bis[N-(1-naphthyl)-N-phenylamino]naphthalene
4,4', 4"-tris[(3-methylphenyl)phenylamino]triphenylamine
  (MTDATA)
4,4'-Bis[N-(3-methylphenyl)-N-phenylamino]biphenyl
  (TPD).

Another class of useful hole-transporting materials includes polycyclic aromatic compounds as described in EP 1 009 041. Tertiary aromatic amines with more than two amine groups may be used, including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

An undoped electron-transporting layer, an undoped sublayer of the electron-transporting layer, the host material of a doped sublayer of the electron-transporting layer, or the host material of the first light-emitting layer of this invention comprises at least one electron-transporting material. Preferred electron-transporting materials are metal chelated oxinoid compounds, including chelates of oxine itself (also commonly referred to as 8-quinolinol or 8-hydroxyquinoline) as disclosed in U.S. Pat. No. 4,885,211. Tris(8-quinolinolato)aluminum(III) also commonly known as Alq is one of the commonly used electron-transporting materials. Such compounds exhibit high levels of performance and are readily fabricated in the form of thin layers. Such compounds are more fully described in Formula E.

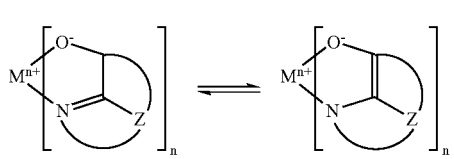

E wherein:
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Some examples of useful electron-transporting materials are:
Aluminum trisoxine [alias, tris(8-quinolinolato)aluminum (III)](Alq)
Magnesium bisoxine [alias, bis(8-quinolinolato)magnesium (II)](Mgq)
Bis[benzo{f}-8-quinolinolato]zinc (II)
Bis(2-methyl-8-quinolinolato)aluminum(III)-μ-oxo-bis(2-methyl-8-quinolinolato) aluminum(III)
Indium trisoxine [alias, tris(8-quinolinolato)indium](Inq)
Aluminum tris(5-methyloxine) [alias, tris(5-methyl-8-quinolinolato) aluminum(III)]
Lithium oxine [alias, (8-quinolinolato)lithium(I)]
Gallium oxine [alias, tris(8-quinolinolato)gallium(III)] (Gaq)
Zirconium oxine [alias, tetra(8-quinolinolato)zirconium (IV)].

Related materials, denoted collectively as BAlq, can also be used as electron-transporting materials. Bryan et al., in U.S. Pat. No. 5,141,671, discuss such materials. The BAlq compounds are mixed-ligand aluminum chelates, specifically bis($R_s$-8-quinolinolato)(phenolato)aluminum(III) chelates, where $R_s$ is a ring substituent of the 8-quinolinolato ring nucleus. These compounds are represented by the formula $(R_sQ)_2Al$—O—L. R represents a substituted 8-quinolinolato ligand, $R_s$ represents an 8-quinolinolato ring substituent to block sterically the attachment of more than two substituted 8-quinolinolato ligands to the aluminum ion, OL is phenolato ligand, O is oxygen, and L is phenyl or a hydrocarbon-substituted phenyl moiety of from 6 to 24 carbon atoms.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

A preferred embodiment of the second light-emitting layer comprises a blue host material doped with one or more blue-emitting dopants.

Derivatives of 9,10-di-(2-naphthyl) anthracene (Formula 1) constitute a preferred class of hosts capable of supporting blue electroluminescence Formula 1

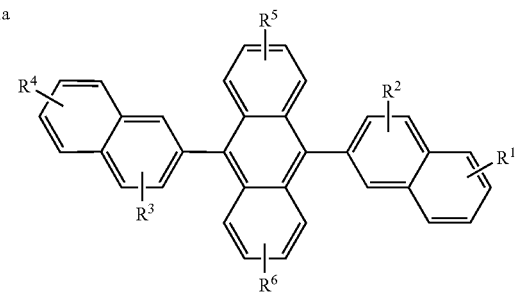

wherein $R_1$-$R_6$ represent one or more substituents on each ring and where each substituent is individually selected from the following categories:
Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which may be bonded via a single bond, or may complete a fused heteroaromatic ring system;

Category 5: alkoxylamino, alkylamino, or arylamino of from 1 to 24 carbon atoms; or Category 6: fluoro, chloro, bromo or cyano.

Illustrative examples include 9,10-di-(2-naphthyl)anthracene (ADN) and 2-t-butyl-9,10-di-(2-naphthyl)anthracene (TBADN). Other anthracene derivatives can be useful as a host in the LEL, such as diphenylanthracene and its derivatives, as described in U.S. Pat. No. 5,927,247. Styrylarylene derivatives as described in U.S. Pat. No. 5,121,029 and JP 08333569 are also useful hosts for blue emission. For example, 9,10-bis[4-(2,2-diphenylethenyl) phenyl]anthracene and 4,4'-Bis(2,2-diphenylethenyl)-1,1'-biphenyl (DPVBi) are useful hosts for blue emission.

Hosts for the second light-emitting layer can also be used for the first light-emitting layer alone or in combination with other electron-transporting materials.

Many blue-emitting dopants are known in the art and are contemplated for use in the practice of this invention. Particularly useful classes of blue-emitting dopants include perylene and its derivatives such as 2,5,8, 11-tetra-tert-butyl perylene (TBP), and amino derivative of distyryl benzene as described in U.S. Pat. No. 5,121,029, such as 1,4-bis(4-ditolylaminostyryl)benzene (structure shown below): A particularly preferred blue dopant of this class is 1,4-bis(4-ditolylamino-β-styryl)benzene (DTASB)

Formula 2

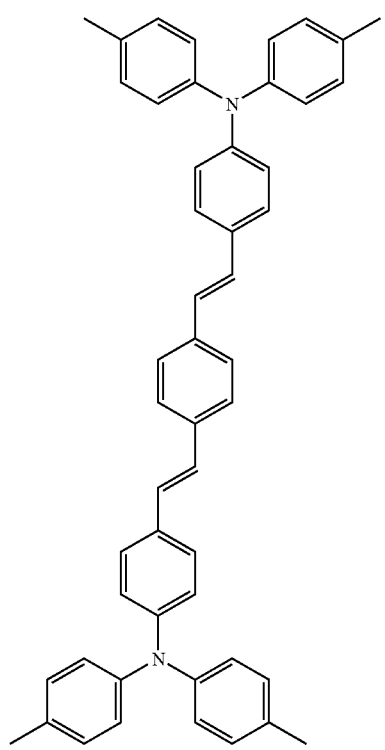

Formula 2 is 1,4-bis(4-ditolylaminostyryl)benzene (DTASB).

Another useful class of blue-emitting dopants is represented by Formula 3 and is described in commonly assigned U.S. patent application Ser. No. 10/183,242 filed Jun. 27, 2002 by Benjamin P. Hoag et al., entitled "Organic Element for Electroluminescent Devices"; the disclosure of which is herein incorporated by reference.

Formula 3

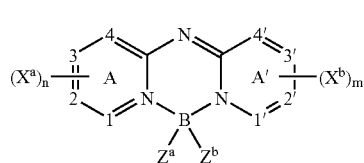

wherein:

A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

Preferred blue-emitting dopants further include materials where the two fused ring systems are quinoline or isoquinoline systems; the aryl or heteroaryl substituent is a phenyl group; there are present at least two $X^a$ groups and two $X^b$ groups which join to form a 6-6 fused ring, the fused ring systems are fused at the 1-2, 3-4, 1'-2', or 3'-4' positions, respectively; one or both of the fused rings is substituted by a phenyl group; and where the dopant is depicted in Formula 4, 5, or 6.

Formula 4

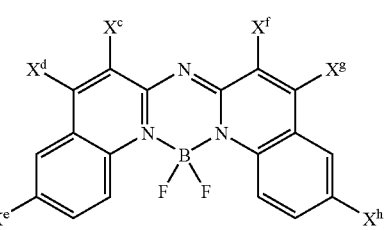

Formula 5

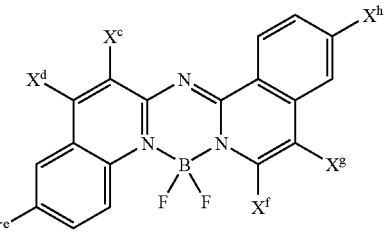

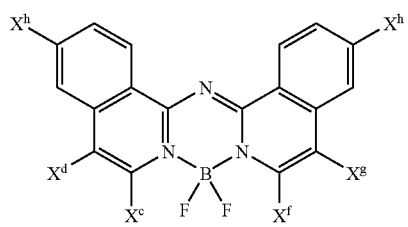

Formula 6 wherein each $X^c$, $X^d$, $X^e$, $X^f$, $X^g$, and $X^h$ is hydrogen or an independently selected substituent, one of which must be an aryl or heteroaryl group.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms.

Illustrative, non-limiting examples of boron compounds complexed by two ring nitrogens of a deprotonated bis(azinyl)amine ligand, wherein the two ring nitrogens are members of different 6,6 fused ring systems in which at least one of the systems contains an aryl or heteroaryl substituent, useful in the present invention are the following:

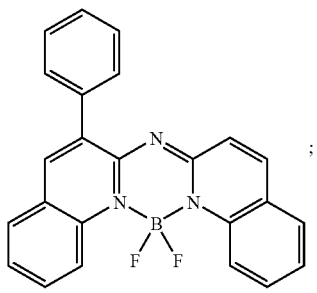

Formula 10

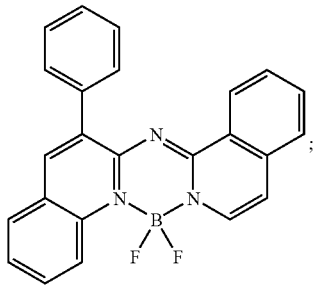

Formula 11

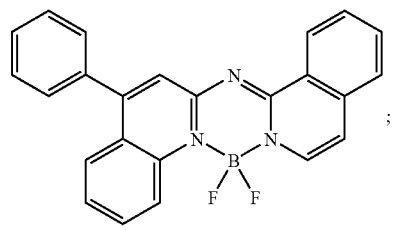

Formula 7

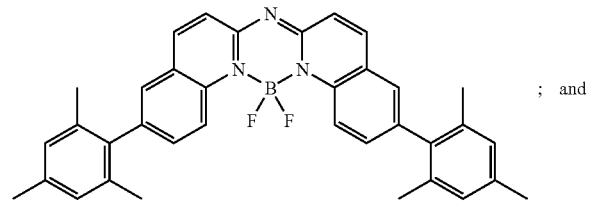

Formula 12

; and

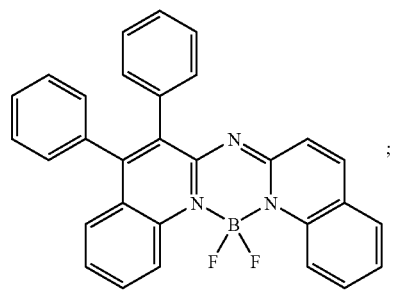

Formula 8

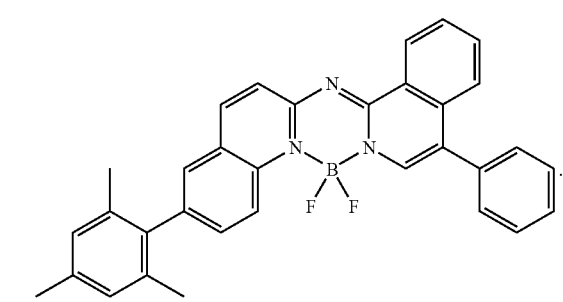

Formula 13

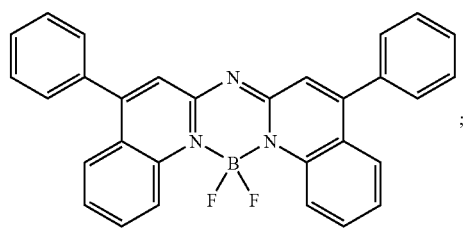

Formula 9

Preferred materials for use as yellow-emitting dopants in the hole-transporting layer, the first light-emitting layer, or the electron-transporting layer, are those represented by Formula 14.

Formula 14

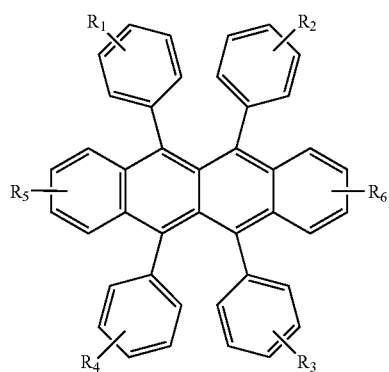

wherein $R_1$–$R_6$ represent one or more substituents on each ring and where each substituent is individually selected from one of the categories described above. Preferred as $R_1$–$R4$ are substituents selected from categories 3 and 4 above.

Examples of particularly useful yellow dopants include 5,6,11,12-tetraphenylnaphthacene (rubrene); 6,11-diphenyl-5,12-bis(4-(6-methyl-benzothiazol-2-yl)phenyl)naphthacene (DBzR) and 5,6,11,12-tetra(2-naphthyl)naphthacene (NR), the formulas of which are shown below:

Formula 15

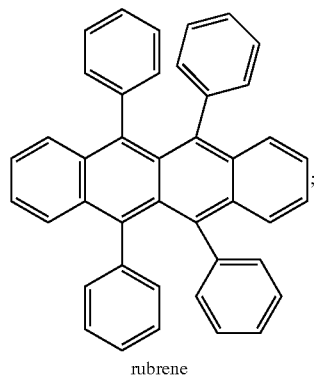

rubrene

Formula 16

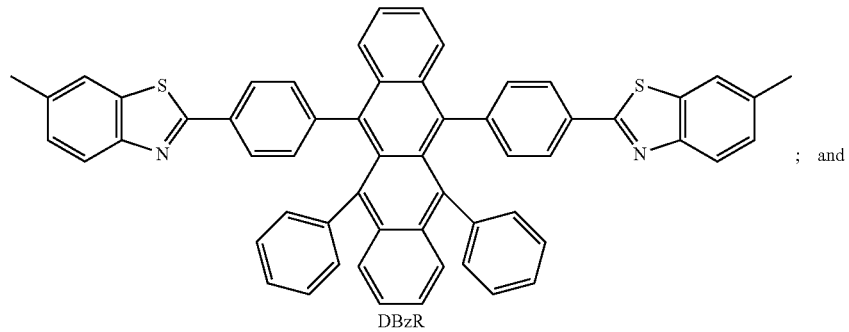

DBzR

; and

Formula 17

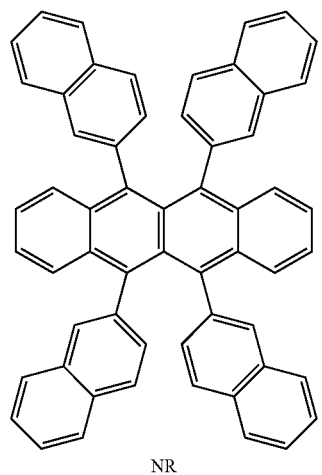

NR

More than one yellow-emitting dopant may be used in the hole-transporting layer, emission layer, or the electron-transporting layer. The same or different yellow-emitting dopants may be used in these layers.

EXAMPLES

The invention and its advantages are illustrated by the examples that follow. The term "percentage" indicates the percentage by volume as measured using thin-film deposition monitors of a particular dopant relative to the host material. The procedure for fabrication of all of the OLEDs described hereinafter is illustrated for the case of comparative Example 1. The current-voltage characteristics of each OLED were evaluated using a constant-current source-meter. The electroluminescence spectrum and yield were evaluated using the constant-current source and a diode-array spectrometer. The emission was filtered through a red, green, or blue filter and the photometric performance for each color was also measured. For some of the examples, the power consumption of a full-color 2.2" diagonal OLED display panel was calculated for luminance of 100 cd/m$^2$ at the D6000 white point. The operational stability (device lifetime) was evaluated by operating an OLED at a constant current density of 20 mA/cm$^2$ and room temperature while monitoring its luminance and drive voltage.

The OLED device of Example 1 had the same structure as the OLED device shown in FIG. 2. An 85 nm layer of ITO on a glass substrate 210 was patterned to define the anodes 220 of several OLEDs on the same substrate. The anodes were sequentially ultra-sonicated in a commercial detergent, rinsed in deionized water, and degreased in toluene vapor. The ITO layer was treated with an oxygen plasma for about one minute and then coated with 1 nm of a fluorocarbon layer, the hole-injecting layer 230, by plasma assisted deposition of CHF$_3$. The resulting coated substrate was transferred to a vacuum chamber, where the following additional layers were in-situ fabricated sequentially over the hole-injecting layer by vacuum vapor deposition. First 150 nm of NPB was deposited as the hole-transporting layer 240. Then the blue light-emitting layer 250 including 20 nm of TBADN doped with 2.5% (DTASB) was formed followed by 35 nm of Alq as the electron-transporting layer (ETL) 270, and finally 220 nm of Mg containing 10% Ag, patterned so as to supply the cathodes 280 for the several OLEDs. The above sequence completed the deposition of the OLED devices. The OLED was then hermetically packaged in a glove box filled with dry nitrogen for protection against the ambient environment.

The electroluminescence properties of this device measured by applying a d.c. voltage. This device produced blue light-emitting light with color coordinates, CIEx,y=0.17, 0.36. The performance measured at 20 mA/cm2 constant current density gave 9.5 drive voltage, 5.2 cd/A luminance efficiency.

The OLEDs of Example 2 was constructed following the OLED structure 300. The light-transmissive anode 320 was treated with an oxygen plasma for about one minute and then coated with 1 nm of a fluorocarbon layer, the hole-injecting layer 330, by plasma assisted deposition of CHF$_3$. The resulting coated substrate was transferred to a vacuum chamber, where the following additional layers were in-situ fabricated sequentially over the hole-injecting layer by vacuum vapor deposition. First 150 nm of NPB was deposited as the hole-transporting layer 340. Then the first light-emitting layer 350 including 20 nm Alq doped with 1% DBzR was deposited on the hole-transporting layer 340. Then the blue light-emitting layer 360 including 20 nm of TBADN doped with 2.5% (DTASB) was formed followed by 35 nm of Alq as the electron-transporting layer (ETL) 370, and finally 220 nm of Mg containing 10% Ag, patterned so as to supply the cathodes 380 for the several OLEDs. Surprisingly, this device of Example 2 produced white light. The color coordinates of the white emission were CIEx, y=0.43, 0.48. The drive voltage measured at 20 mA/cm2 was 9.4 volts and the luminance efficiency of 10.8 cd/A.

The OLEDs of Examples 3–6 were constructed similarly to that of Comparative Example 2 with varying percentages of DBzR into Alq host of the yellow light-emitting layer 350. All the layers of Comparative Examples 3 to 6 were the same as Example 2, except that the yellow light-emitting layer 350. Table 1 also reports the performance of the devices of Example 1 to 6 measured at a current density of 20 mA/cm$^2$ in terms of drive voltage and photometric parameters (luminance yield and CIE coordinates).

TABLE 1

Device properties of Examples 1 to 6
All the devices have 85 nm ITO anode, 0.5 nm CFx hole injection layer and 200 nm MgAg cathode

| Device Examples | HTL layer (NPB) | Alq layer doped with yellow dopant DBzR | Yellow emitting dopant % into 20 nm Alq | Blue emitting layer (TBADN with 2.5% DTASB blue dopant) | AlQ undoped ETL | Drive Volt. (V) @ 20 mA/cm$^2$ | Luminance Yield (cd/A) @ 20 mA/cm$^2$ | CIEx | CIEy | Color |
|---|---|---|---|---|---|---|---|---|---|---|
| 1 | 150 nm | NIL | NIL | 20 nm | 35 nm | 9.2 V | 7.0 | 0.17 | 0.37 | Blue |
| 2 | 150 nm | 20 nm | 1% DBzR | 20 nm | 35 nm | 9.4 V | 10.8 | 0.43 | 0.48 | White |
| 3 | 150 nm | 20 nm | 1.5% DBzR | 20 nm | 35 nm | 9.4 V | 10.5 | 0.44 | 0.47 | White |
| 4 | 150 nm | 20 nm | 2% DBzR | 20 nm | 35 nm | 9.4 V | 10.0 | 0.44 | 0.46 | White |
| 5 | 150 nm | 20 nm | 2.5% DBzR | 20 nm | 35 nm | 9.5 V | 9.2 | 0.45 | 0.45 | White |
| 6 | 150 nm | 20 nm | 3% DBzR | 20 nm | 35 nm | 9.3 V | 8.6 | 0.45 | 0.45 | White |

Figure 7:
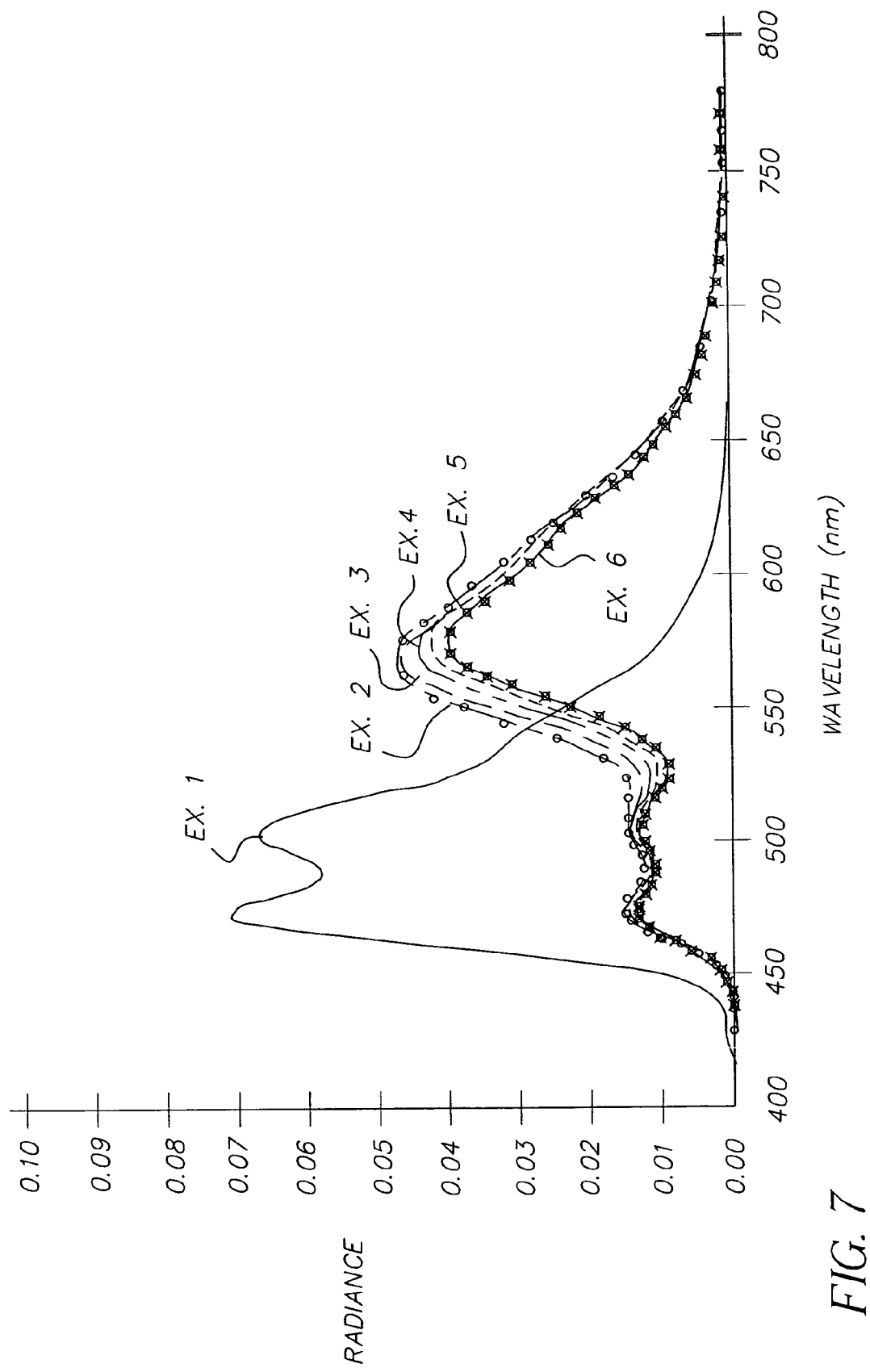
FIGS. 7–10 depicts EL spectra of the white OLED devices corresponding to the device structures shown in FIGS. 3–6.

The EL spectra of the devices of Examples 1–6, also at 20 mA/cm$^2$, are shown in FIG. 7. As the percentage of DBzR in the yellow light-emitting layer 350 increased, the intensity in the red portion of the spectrum increased. However, there was no significant effect in the blue portion of the spectrum.

The OLEDs of Example 7 were prepared following the structure of OLED 400 as shown in FIG. 4. The hole-transporting layer includes a 150 nm thick undoped NPB (440). The first yellow light-emitting layer 450 includes 20 nm Alq co-doped with 2% DBzR. The blue light-emitting layer 460 was a 20 nm thick layer of TBADN as host doped with 2.5% (DTASB) shown by Formula 2 as a blue-emitting dopant. The electron-transporting layer includes two sub-layers 471 and 472. Sublayer 471 closest to the blue light-emitting layer 460 was yellow light-emitting and includes 20 nm of Alq with 1% DBzR. This device produced white emitting light with color coordinates, CIEx, y=0.42, 0.46. The performance measured at 20 mA/cm constant current density gave 10.4 drive voltage, 8.6 cd/A luminance efficiency.

Figure 8:
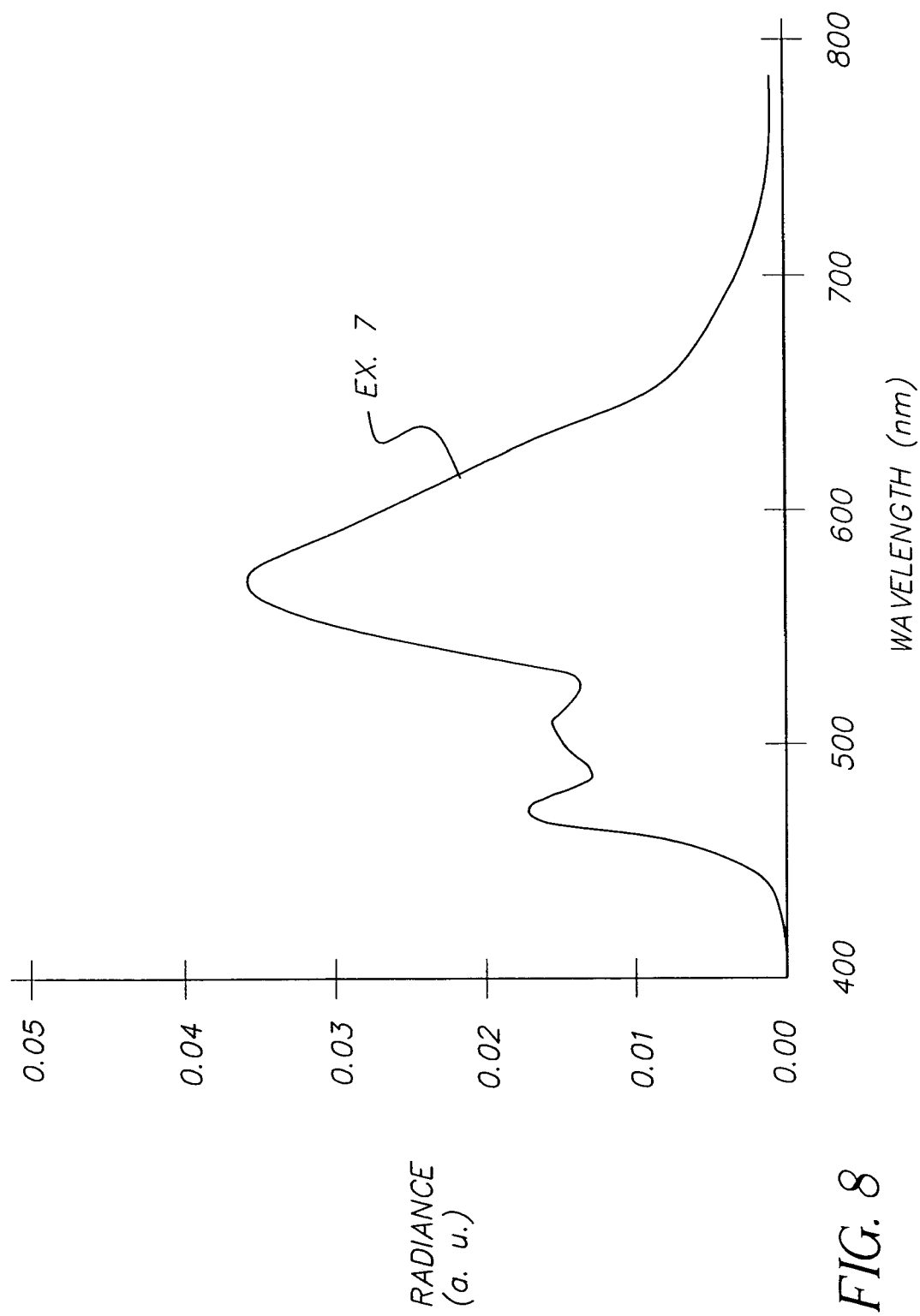
Figure 12:
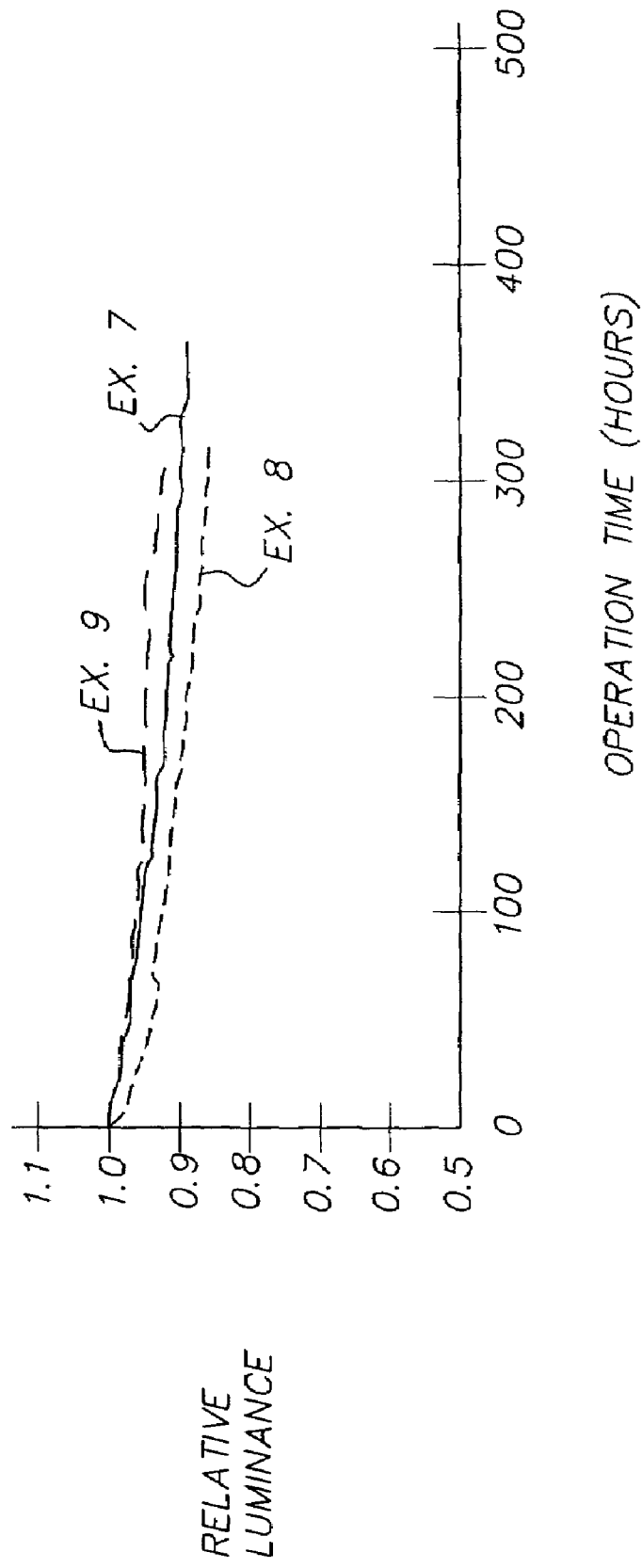

The EL spectra of the devices of Example 7, also at 20 mA/cm$^2$, are shown in FIG. 8. This device has excellent fade stability as shown in FIG. 12.

The operational stability (device lifetime) was evaluated by operating an OLED at a constant current density of 20 mA/cm$^2$ and room temperature or 70° C. while monitoring its luminance and drive voltage.

Figure 11:
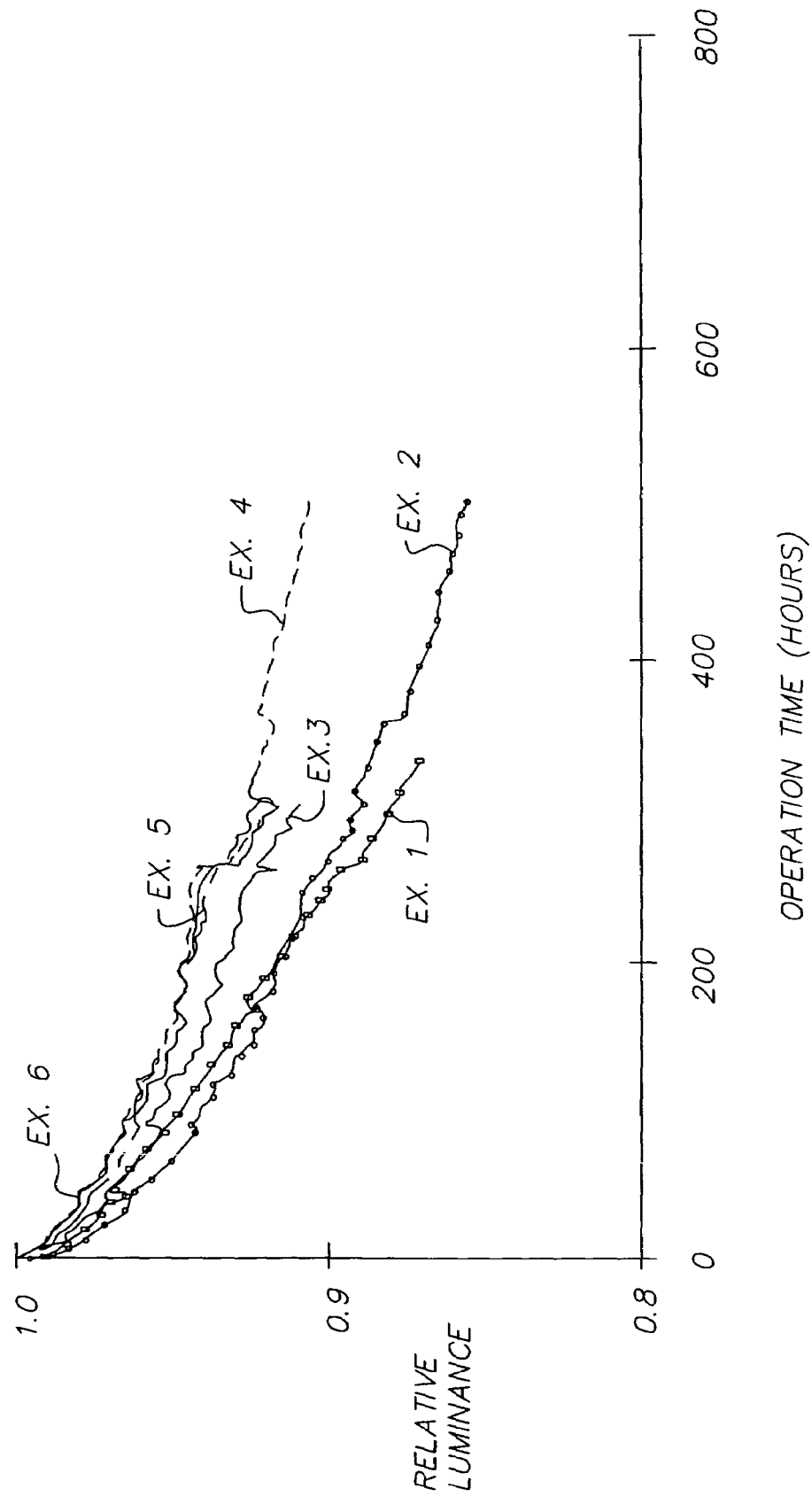
FIGS. 11–12 show fade stability plots as a function of aging time.

Fade stability plots as a function of operating time for devices of Examples 1 to 6 are shown in FIG. 11. All the devices of Examples 2 to 6 shows good operational stability.

TABLE 2

Device properties of Example 7 to 9
All the devices have 85 nm ITO anode, 0.5 nm CFx hole injection layer and 200 nm MgAg cathode

| Device Examples | HTL layer (NPB) | HTL doped with yellow dopant DBzR | Alq layer doped with yellow dopant DBzR | Blue emitting layer (TBADN with 2.5% DTASB blue dopant) | Alq layer doped with DBzR | Alq layer undoped | Drive Volt. (V) | Luminance Yield (cd/A) | CIEx | CIEy | Color |
|---|---|---|---|---|---|---|---|---|---|---|---|
| 7 | 130 nm | Nil | Alq 20 nm + 2% DBzR | 20 nm | Alq 20 nm + 1.0% DBzR | 15 nm | 10.5 | 8.6 | 0.42 | 0.46 | White |
| 8 | 130 nm | 20 nm NPB + 2% DBzR | Alq 10 nm + 1% DBzR | 20 nm | Nil | 35 nm | 9.2 | 8.84 | 0.414 | 0.455 | White |
| 9 | 130 nm | 20 nm NPB + 2% DBzR | Alq 10 nm + 1% DBzR | 20 nm | Alq 20 nm + 1.0% DBzR | 15 nm | 9.6 | 8.1 | 0.41 | 0.45 | White |

The OLEDs of Example 8 was prepared following the structure of OLED 500 as shown in FIG. 5. The hole-transporting layer includes a 130 nm thick undoped NPB (541). Then 20 nm NPB layer was deposited by co-doping with 2% DBzR. The first yellow light-emitting layer 550 includes 20 nm Alq co-doped with 2% DBzR. The blue light-emitting layer 560 was a 20 nM thick layer of TBADN as host doped with 2.5% (DTASB) shown by Formula 2 as a blue light-emitting dopant. Then 35 nm Alq was deposited as electron-transporting layer 472 followed by 220 nm Mg:Ag cathode. This device produced white emitting light with color coordinates, CIEx, y=0.43, 0.44. The performance measured at 20 mA/cm2 constant current density gave 9.2 drive voltage, 8.8 cd/A luminance efficiency.

Figure 9:
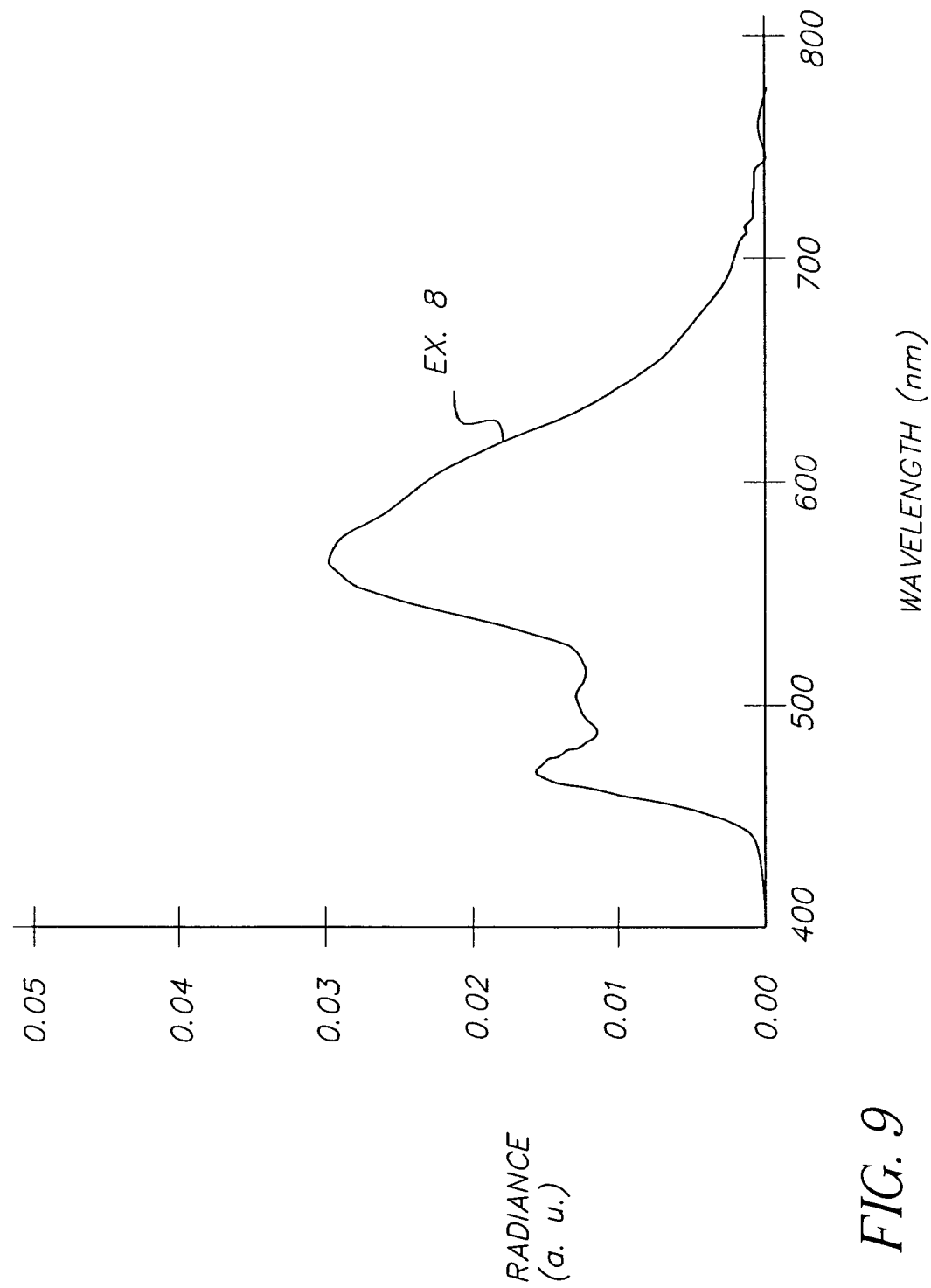

The EL spectra of the devices of Examples 8, also at 20 mA/cm$^2$, are shown in. FIG. 9.

This device has excellent fade stability as shown in FIG. 12.

The OLEDs of Example 9 were prepared following the structure of OLED 600 as shown in FIG. 6. The hole-transporting layer includes a 130 nm thick undoped NPB (641). Then 20 nm NPB layer was deposited by co-doping with 2% DBzR. The first yellow light-emitting layer 650 includes 20 nm Alq co-doped with 2% DBzR. The blue light-emitting layer 660 was a 20 nm thick layer of TBADN as host doped with 2.5% (DTASB) shown by Formula 2 as a blue-emitting dopant. The electron-transporting layer includes two sublayers 671 and 672. Sublayer 671 closest to the blue light-emitting layer 660 was yellow light-emitting and includes 20 nm of Alq with 1% DBzR. Electron-transporting sub-layer 672 was 15 nm Alq. This was followed by 220 nm Mg:Ag cathode. This device produced white emitting light with color coordinates, CIEx, y=0.41, 0.45. The performance measured at 20 mA/cm$^2$ constant current density gave 9.6 drive voltage, 8.1 cd/A luminance efficiency.

Figure 10:
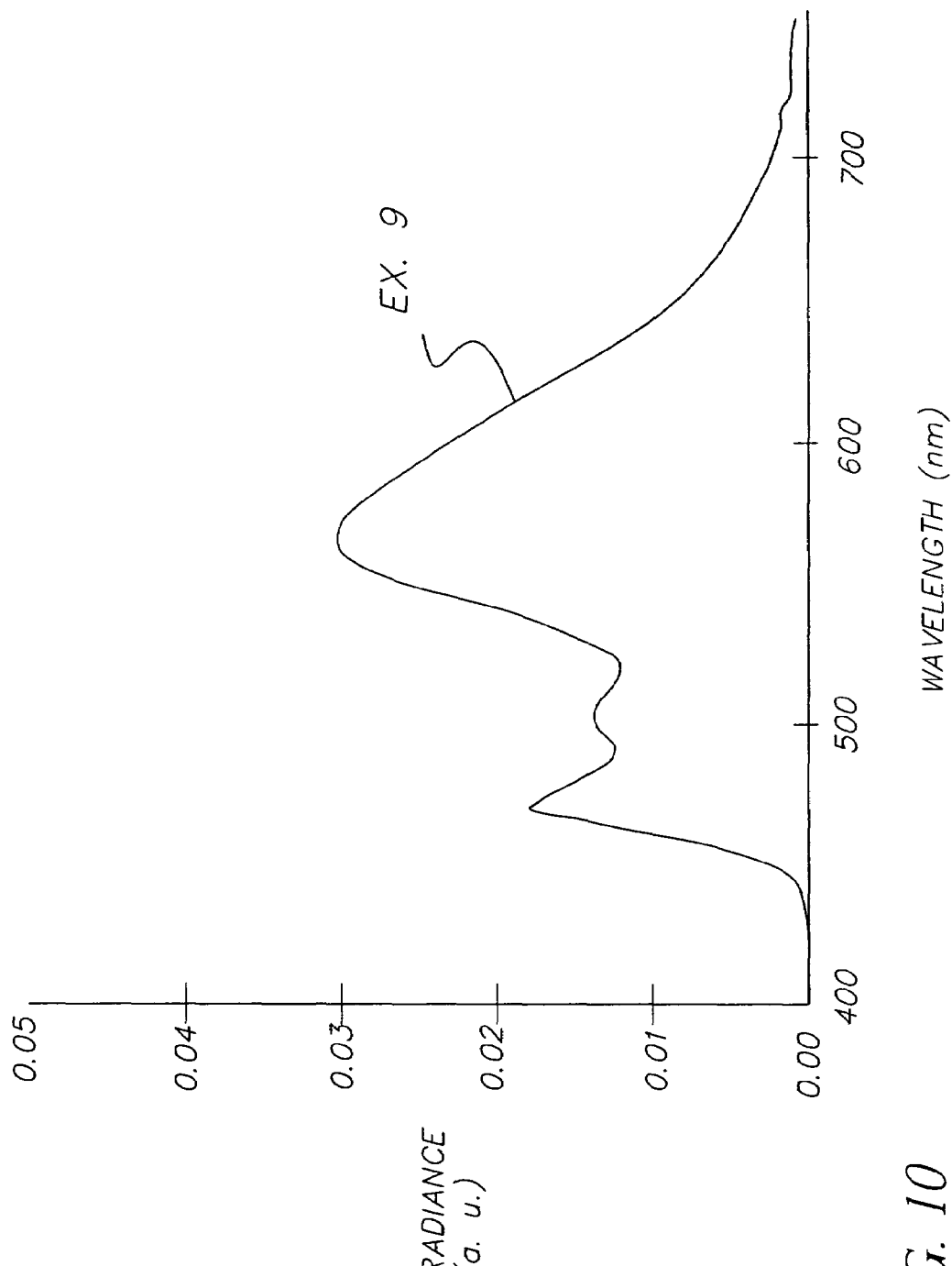

The EL spectra of the devices of Example 9, also at 20 mA/cm$^2$, is shown in FIG. 10. This device has excellent fade stability as shown in FIG. 12.

Fade stability plots as a function of operating time for devices of Examples 7 to 9 are shown in FIG. 12. All the devices of Examples 2 to 6 show good operational stability. However, the devices 7 and 9 show significantly better stability.

It is clearly seen that the white emitting devices with good efficiency and stability are prepared following the teaching of this invention The stability of the device was simultaneously improved. This shows that the improvement in the luminance efficiency, reduction in power consumption and improved lifetime was achieved. Thus, white OLED devices prepared by following the different structures of this invention have high performance and high operational stability.

The invention has been described in detail with particular reference to certain preferred embodiments thereof, but it will be understood that variations and modifications can be effected within the spirit and scope of the invention. For example, multiple dopants can be used in any of the hole-transporting, electron-transporting or light-emitting layers.

PARTS LIST

100 OLED with a simple structure
110 substrate
120 anode
140 light-emitting layer
180 cathode
200 OLED with a multilayer structure
210 substrate
220 light-transmissive anode
230 hole-injecting layer
240 hole-transporting layer
250 light-emitting layer (LEL)
270 electron-transporting layer (ETL)
280 cathode
300 OLED structure
310 light-transmissive substrate
320 light-transmissive anode
330 hole-injecting layer 340 hole-transporting layer
350 first light-emitting layer
360 second light-emitting layer
370 organic electron-transporting layer
380 cathode
400 OLED structure
410 substrate
420 anode
430 hole-injecting layer
440 hole-transporting layer
450 first light-emitting layer
460 second light-emitting layer
471 electron-transporting sublayer doped with yellow dopant
472 electron-transporting sublayer, not doped
480 cathode
500 OLED structure
510 substrate
520 anode
530 hole-injecting layer
541 hole-transporting sublayer, not doped
542 hole-transporting sublayer doped with yellow dopant
550 first light-emitting layer
560 second light-emitting layer
570 electron-transporting layer
580 cathode
600 OLED structure
610 substrate
620 anode
630 hole-injecting layer
641 hole-transporting sublayer layer
642 hole transporting sublayer doped with yellow dopant
650 first light-emitting layer
660 second light-emitting layer
671 electron-transporting sublayer doped with yellow dopant
672 electron-transporting sublayer, not doped
680 cathode

What is claimed is:

1. A white light-emitting OLED device, comprising:
  a) an anode and a cathode spaced apart from one another;
  b) a hole-transporting layer disposed over the anode;
  c) a first light-emitting layer disposed on the hole-transporting layer including an electron-transporting material host and a yellow light-emitting dopant for producing yellow light;
  d) a second light-emitting layer disposed on the first light-emitting layer and including a blue host and a blue dopant for producing blue light; and
  e) an electron-transporting layer disposed between the cathode and the second light-emitting layer.

2. The white light-emitting OLED device of claim 1 wherein the first light-emitting layer host includes Alq, Gaq, Inq, or Mgq.

3. The white light-emitting OLED device of claim 1 wherein the blue host includes ADN or TBADN.

4. The white light-emitting OLED device of claim 1 wherein the yellow light-emitting dopant includes

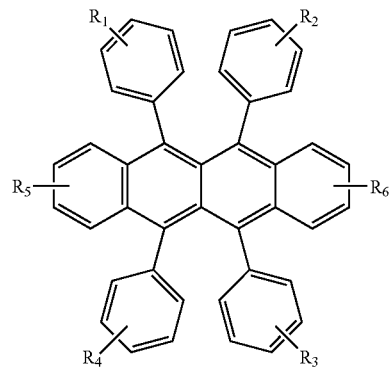

wherein $R_1$, $R_2$, $R_3$, $R_4$, $R_5$, $R_6$ represent one or more substituents on each ring where each substituent is individually selected from the following groups:
  Group 1: hydrogen, or alkyl of from 1 to 24 carbon atoms;
  Group 2: aryl or substituted aryl of from 5 to 20 carbon atoms;
  Group 3: carbon atoms from 4 to 24 necessary to complete a fused aromatic ring of phenyl, naphthyl, anthracenyl, phenanthryl, pyrenyl, or perylenyl;
  Group 4: heteroaryl or substituted heteroaryl of from 5 to 24 carbon atoms such as thiazolyl, furyl, thienyl, pyridyl, quinolinyl or other heterocyclic systems, which may be bonded via a single bond, or may complete a fused heteroaromatic ring system;
  Group 5: alkoxylamino, alkylamino, or arylamino of from 1 to 24 carbon atoms; or
  Group 6: fluorine, chlorine, bromine or cyano.

5. The white light-emitting OLED device of claim 4 wherein the yellow light-emitting dopant includes 5,6,11,12-tetraphenylnaphthacene (rubrene); 6,11-diphenyl-5,12-bis(4-(6-methyl-benzothiazol-2-yl)phenyl)naphthacene (DBzR) or 5,6,11,12-tetra(2-naphthyl)naphthacene (NR), with the following formulas:

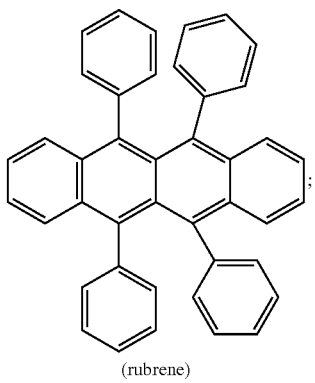

(rubrene)

-continued

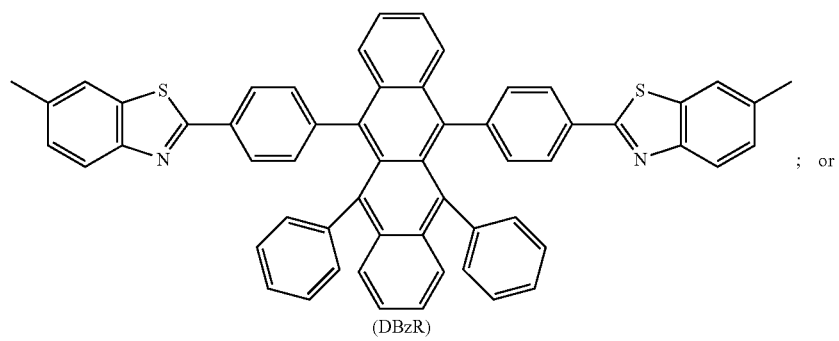
(DBzR) ; or

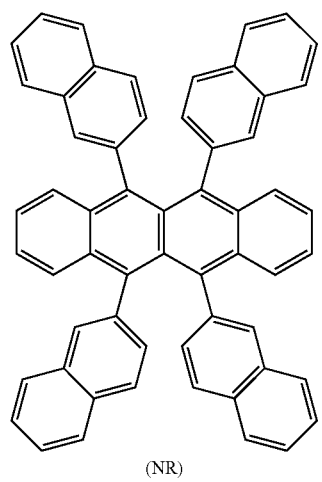
(NR)

6. The white light-emitting OLED device of claim 5 wherein the concentration of yellow light-emitting dopant 5,6,11,12-tetraphenylnaphthacene (rubrene); 6,11-diphenyl-5,12-bis(4-(6-methyl-benzothiazol-2-yl)phenyl)naphthacene (DBzR) or 5,6,11,12-tetra(2-naphthyl)naphthacene (NR) is in a range of from greater than 0 and less than 30% by volume of the electron-transporting material host.

7. The white light-emitting OLED device of claim 5 wherein the concentration of yellow light-emitting dopant 5,6,1 1,12-tetraphenylnaphthacene (rubrene); 6,11-diphenyl-5,12-bis(4-(6-methyl-benzothiazol-2-yl)phenyl)naphthacene (DBzR) or 5,6,11,12-tetra(2-naphthyl)naphthacene (NR) is preferably in a range of from greater than 0 and less than 5% by volume of the electron-transporting material host.

8. The white light-emitting OLED device of claim 1 wherein the thickness of the first light-emitting layer is between 5 nm to 100 nm.

9. The white light-emitting OLED device of claim 1 wherein the thickness of the second light-emitting layer is between 5 nm to 100 nm.

10. The white light-emitting OLED device of claim 1 wherein the blue dopant includes distyrylamine derivatives as shown by the formula

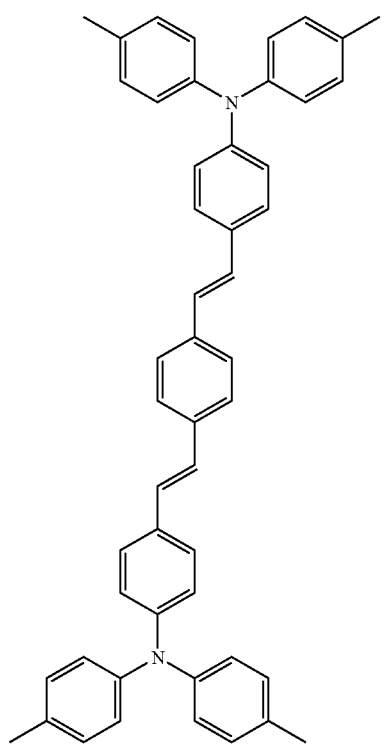

11. The white light-emitting OLED device of claim 1 wherein the blue-emitting dopant includes perylene and its derivatives.

12. The white light-emitting OLED device of claim 1 wherein the blue dopant is represented by the following formulas:

B-2
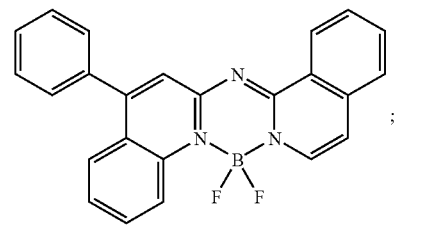

B-3
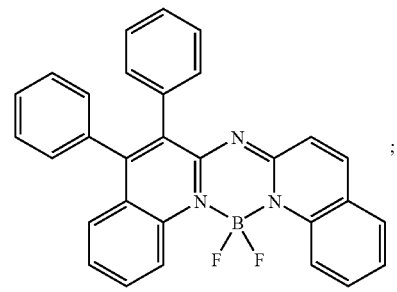

B-4
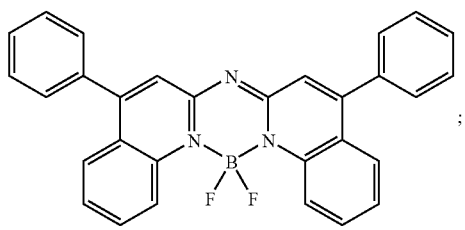

B-5
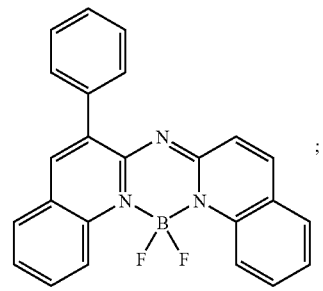

B-6
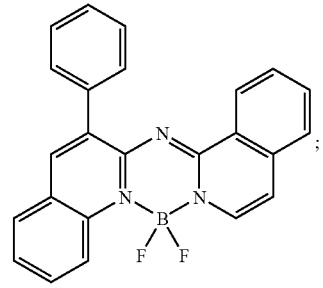

-continued

B-7
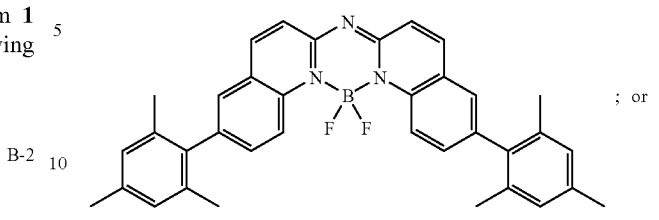
; or

B-8
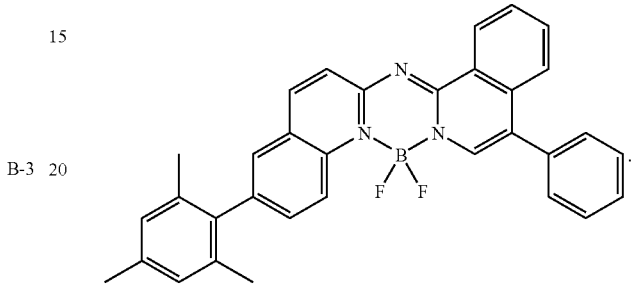

13. The white light-emitting OLED device of claim 12 wherein the concentration of blue-emitting dopants is in the range of greater than 0 and less than 10% by volume of the blue host.

14. The white light-emitting OLED device of claim 12 wherein thickness of the hole-transporting layer is between 10 nm–300 nm.

15. A white light-emitting OLED device, comprising:
  a) an anode and a cathode spaced apart from one another;
  b) a hole-transporting layer disposed over the anode;
  c) a first light-emitting layer disposed on the hole-transporting layer including a first electron-transporting material host and a first yellow light-emitting dopant for producing yellow light;
  d) a second light-emitting layer disposed on the first light-emitting layer and including a blue host and a blue dopant for producing blue light; and
  e) at least one electron-transporting layer adjacent to the second light-emitting layer, and disposed between the second light-emitting layer and the cathode, comprising a second electron-transporting material host and a second yellow light-emitting dopant.

16. The white light-emitting OLED device of claim 15 wherein the first electron-transporting material host and the second electron-transporting material host are the same or different.

17. The white light-emitting OLED device of claim 15 wherein the first electron-transporting material host and the second electron-transporting material host includes Alq, Gaq, Inq, or Mgq.

18. The white light-emitting OLED device of claim 15 wherein the blue host in the second light-emitting layer includes ADN or TBADN.

19. The white light-emitting OLED device of claim 15 wherein the first or second yellow dopants include

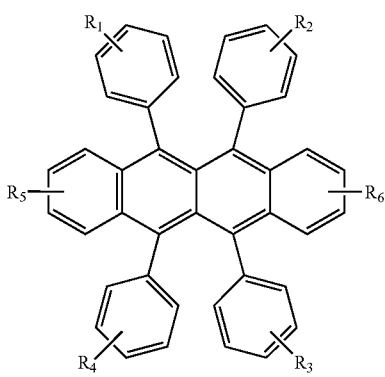

wherein $R_1$, $R_2$, $R_3$, $R_4$, $R_5$, $R_6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of phenyl, naphthyl, anthracenyl, phenanthryl, pyrenyl, or perylenyl;

Group 4: heteroaryl or substituted heteroaryl of from 5 to 24 carbon atoms such as thiazolyl, furyl, thienyl, pyridyl, quinolinyl or other heterocyclic systems, which may be bonded via a single bond, or may complete a fused heteroaromatic ring system;

Group 5: alkoxylamino, alkylamino, or arylamino of from 1 to 24 carbon atoms; or Group 6: fluorine, chlorine, bromine or cyano.

20. The white light-emitting OLED device of claim 15 wherein the first and second yellow-emitting dopants includes 5,6,11,12-tetraphenylnaphthacene (rubrene); 6,11-diphenyl-5,12-bis(4-(6-methyl-benzothiazol-2-yl)phenyl) naphthacene (DBzR) or 5,6,11,12-tetra(2-naphthyl)naphthacene (NR), with the following formulas:

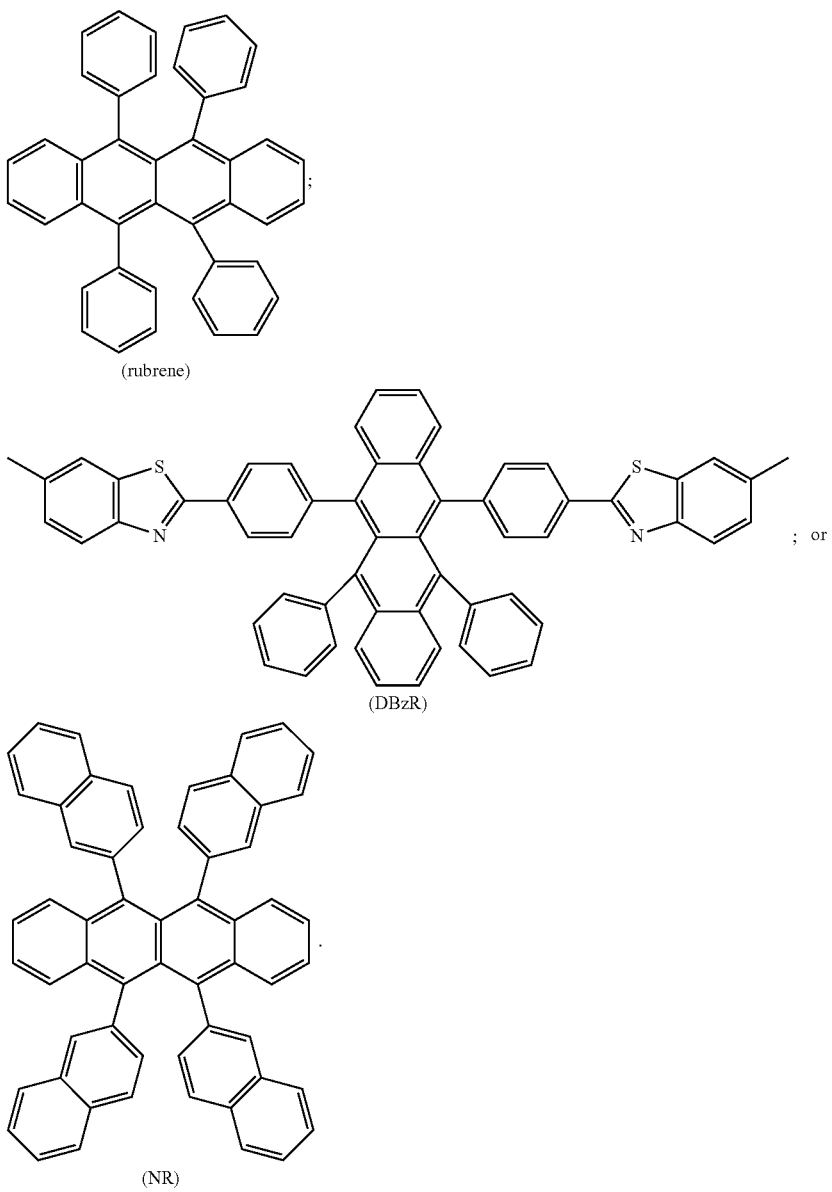

21. The white light-emitting OLED device of claim 15 wherein the first and the second yellow-emitting dopants each include 5,6,11,12-tetraphenylnaphthacene (rubrene); 6,11-diphenyl-5,12-bis(4-(6-methyl-benzothiazol-2-yl)phenyl)naphthacene (DBzR) or 5,6,11,12-tetra(2-naphthyl)naphthacene (NR) and the concentration of the first and second yellow-emitting dopants are individually in a range of from greater than 0 and less than 30% by volume of their corresponding host.

22. The white light-emitting OLED device of claim 21 wherein the concentration of yellow-emitting dopants 5,6,11,12-tetraphenylnaphthacene (rubrene); 6,11-diphenyl-5,12-bis(4-(6-methyl-benzothiazol-2-yl)phenyl)naphthacene (DBzR) or 5,6,11,1 2-tetra(2-naphthyl)naphthacene (NR) are individually in a range of from greater than 0 and less than 5% by volume of their corresponding host.

23. The white light-emitting OLED device of claim 15 wherein the thickness of the first emission layer is between 5 nm to 100 nm.

24. The white light-emitting OLED device of claim 15 wherein the thickness of the second emission layer is between 5 nm to 100 nm.

25. The white light-emitting OLED device of claim 15 wherein the blue dopant includes distyrylamine derivatives includes

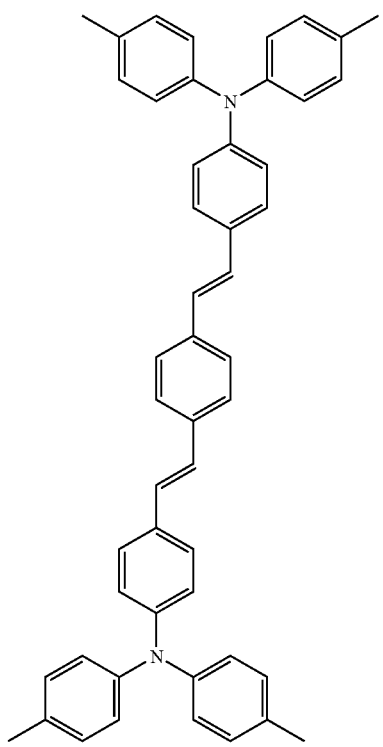

26. The white light-emitting OLED device of claim 15 wherein the blue dopant includes perylene and its derivatives.

27. The white light-emitting OLED device of claim 15 wherein the blue dopant is represented by the following formulas:

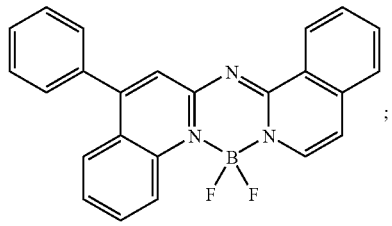
B-2

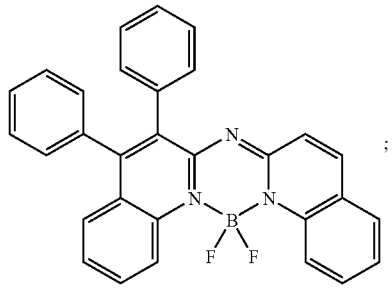
B-3

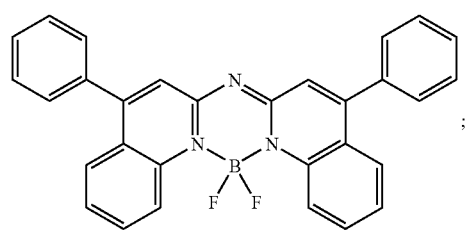
B-4

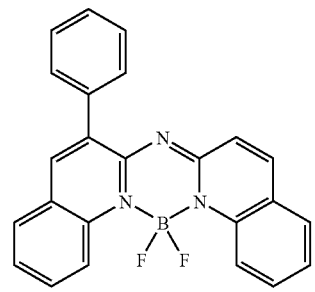
B-5

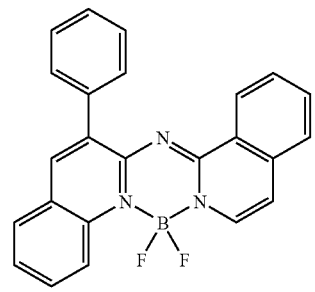
B-6

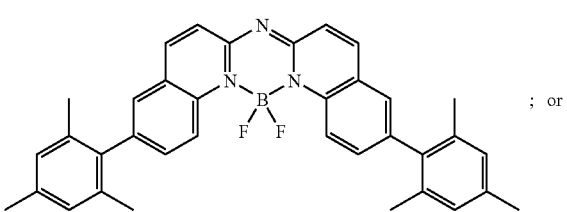
B-7

; or

-continued

B-8

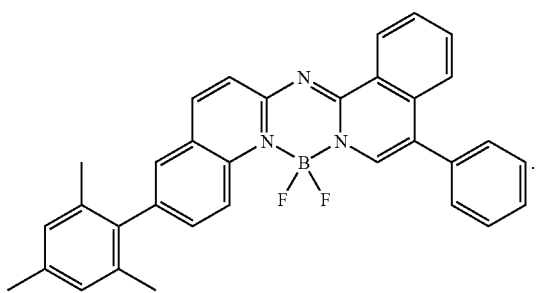

28. The white light-emitting OLED device of claim 15 wherein the concentration of blue-emitting dopant is in the range of greater than 0 and less than 10% by volume of the blue host material.

29. The white light-emitting OLED device of claim 15 wherein thickness of the hole-transporting layer is between 10–300 nm.

30. A white light-emitting OLED device, comprising:
a) an anode and a cathode spaced apart from one another;
b) a first hole-transporting layer disposed over the anode;
c) a second hole-transporting layer disposed over the first hole-transporting layer and including a hole-transporting material host and a first yellow light-emitting dopant;
d) a first light-emitting layer disposed on the second hole-transporting layer including a first electron-transporting material host and a second yellow light-emitting dopant for producing yellow light;
e) a second light-emitting layer disposed on the first light-emitting layer including a blue host and a blue dopant for producing blue light; and
f) an electron-transporting layer disposed between the cathode and the second light-emitting layer.

31. The white light-emitting OLED device of claim 30 wherein the first and second yellow dopants are the same or different.

32. The white light-emitting OLED device of claim 30 wherein the first electron-transporting material host includes Alq, Gaq, Inq, or Mgq.

33. The white light-emitting OLED device of claim 30 wherein the blue host in the second emission layer includes ADN or TBADN.

34. The white light-emitting OLED device of claim 30 wherein the first or second yellow dopants include

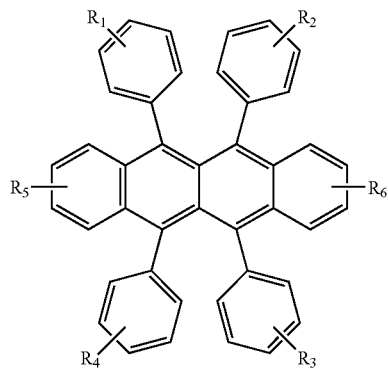

wherein $R_1$, $R_2$, $R_3$, $R_4$, $R_5$, $R_6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of phenyl, naphthyl, anthracenyl, phenanthryl, pyrenyl, or perylenyl;
Group 4: heteroaryl or substituted heteroaryl of from 5 to 24 carbon atoms such as thiazolyl, furyl, thienyl, pyridyl, quinolinyl or other heterocyclic systems, which may be bonded via a single bond, or may complete a fused heteroaromatic ring system;
Group 5: alkoxylamino, alkylamino, or arylamino of from 1 to 24 carbon atoms; or
Group 6: fluorine, chlorine, bromine or cyano.

35. The white light-emitting OLED device of claim 32 wherein the first and second yellow light-emitting dopants includes 5,6,11,12-tetraphenylnaphthacene (rubrene); 6,11-diphenyl-5,12-bis(4-(6-methyl-benzothiazol-2-yl)phenyl) naphthacene (DBzR) or 5,6,11,12-tetra(2-naphthyl)naphthacene (NR), with the following formulas:

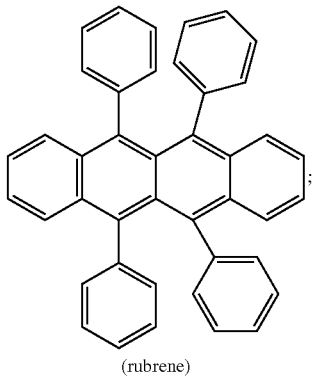

(rubrene)

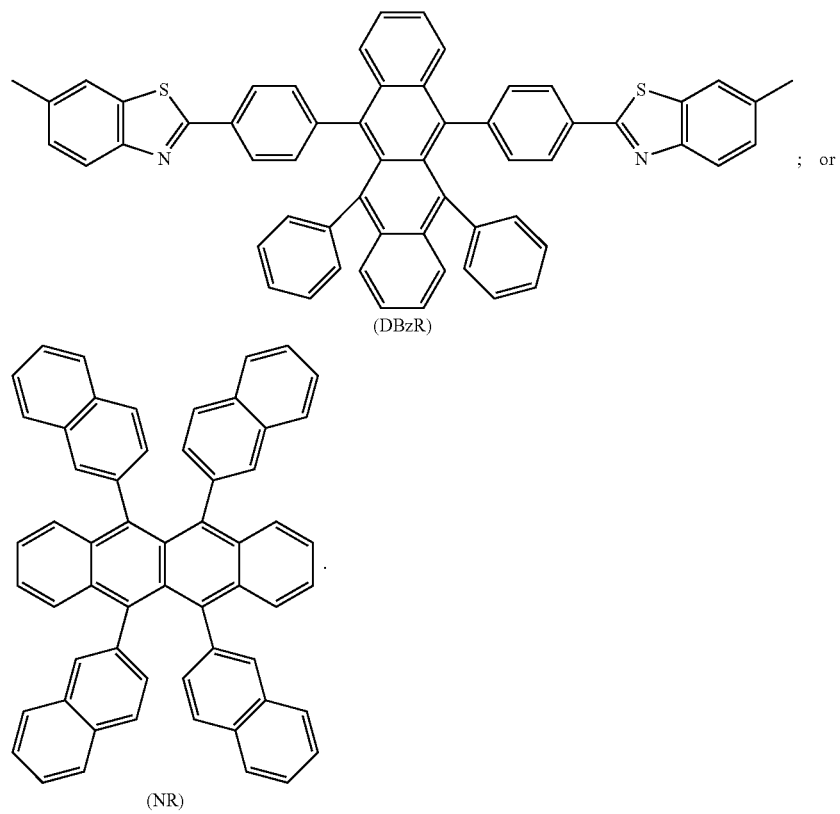

(DBzR); or

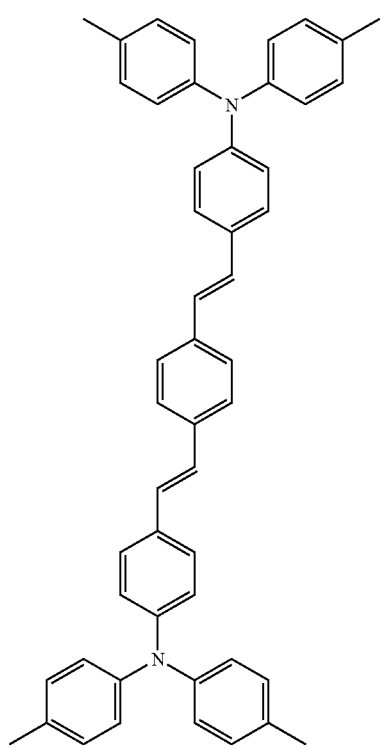

(NR)

36. The white light-emitting OLED device of claim 35 wherein the concentration of the first and the second yellow light-emitting dopants 5,6,11,12-tetraphenylnaphthacene (rubrene); 6,11-diphenyl-5,12-bis(4-(6-methyl-benzothiazol-2-yl)phenyl)naphthacene (DBzR) or 5,6,11,12-tetra(2-naphthyl)naphthacene (NR) are individually in a range of from greater than 0 and less than 30% by volume of the their corresponding host.

37. The white light-emitting OLED device of claim 36 wherein the concentration of yellow light-emitting dopants 5,6,11,12-tetraphenylnaphthacene (rubrene); 6,11-diphenyl-5,12-bis(4-(6-methyl-benzothiazol-2-yl)phenyl)naphthacene (DBzR) or 5,6,11,12-tetra(2-naphthyl)naphthacene (NR) are individually in a range of from greater than 0 and less than 5% by volume of their corresponding host.

38. The white light-emitting OLED device of claim 30 wherein the thickness of the first light-emitting layer is between 5 nm to 100 nm.

39. The white light-emitting OLED device of claim 30 wherein the thickness of the second light-emitting layer is between 5–100 nm.

40. The white light-emitting OLED device of claim 30 wherein the thickness of the electron-transporting layer is between 5–100 nm.

41. The white light-emitting OLED device of claim 30 wherein the blue dopant includes distyrylamine derivatives includes

42. The white light-emitting OLED device of claim 30 wherein the blue-emitting dopant includes perylene and its derivatives.

43. The white light-emitting OLED device of claim 30 wherein the blue dopant is represented by the following formulas:

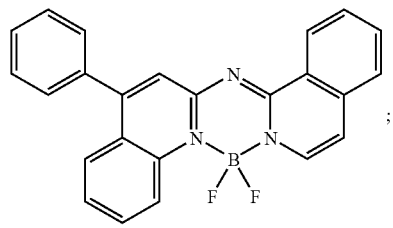
B-2

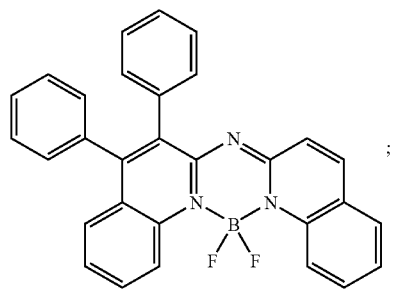
B-3

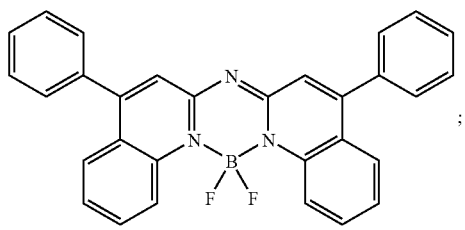
B-4

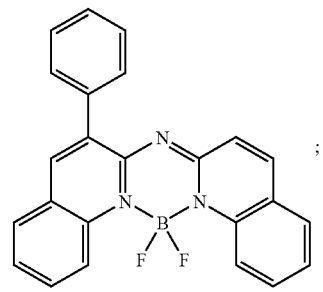
B-5

-continued

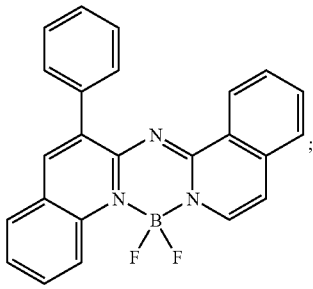
B-6

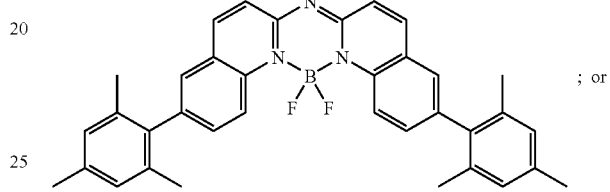
B-7 ; or

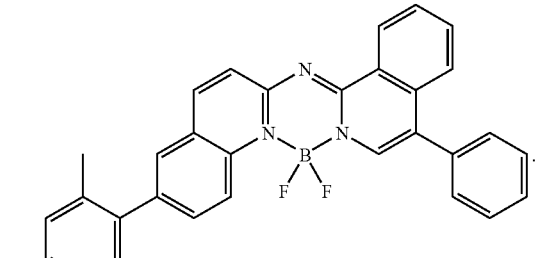
B-8

44. The white light-emitting OLED device of claim 30 wherein the concentration of blue-emitting dopants is in the range of greater than 0 and less than 10% by volume of the blue host material.

* * * * *

UNITED STATES PATENT AND TRADEMARK OFFICE
CERTIFICATE OF CORRECTION

PATENT NO. : 7,037,601 B2  
APPLICATION NO. : 10/657626  
DATED : May 2, 2006  
INVENTOR(S) : Tukaram K. Hatwar It is certified that error appears in the above-identified patent and that said Letters Patent is hereby corrected as shown below:

| | |
|---|---|
| Column 23, line 48, Claim 7 | Claim 7, line 49, ""5,6,1 1,12-tetraphenylnaphthacene"" should read --5,6,11,12-tetraphenylnaphthacene-- |
| Column 32, line 41, Claim 35 | Claim 35, line 41, ""OLED device of claim 32"" should read --OLED device of claim 30-- |

Signed and Sealed this

Twenty-third Day of January, 2007

JON W. DUDAS  
*Director of the United States Patent and Trademark Office*